(12) United States Patent
Ooishi et al.

(10) Patent No.: US 6,385,125 B1
(45) Date of Patent: *May 7, 2002

(54) SYNCHRONOUS SEMICONDUCTOR INTEGRATED CIRCUIT DEVICE CAPABLE OF TEST TIME REDUCTION

(75) Inventors: Tsukasa Ooishi; Hiroaki Tanizaki; Shigeki Tomishima, all of Hyogo; Yutaka Komai, Ibaraki, all of (JP)

(73) Assignees: Mitsubishi Denki Kabushiki Kaisha, Tokyo (JP); Texas Instruments Incorporated, Dallas, TX (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/205,586

(22) Filed: Dec. 4, 1998

(30) Foreign Application Priority Data

Jun. 30, 1998 (JP) ............................................ 10-184703

(51) Int. Cl.⁷ ................................................ G11C 8/00
(52) U.S. Cl. ........................................ 365/233; 365/201
(58) Field of Search ................................. 365/233, 194, 365/201

(56) References Cited

U.S. PATENT DOCUMENTS 5,717,652 A * 2/1998 Ooishi .......................... 365/233
5,886,946 A * 3/1999 Ooishi .......................... 365/233
5,923,613 A * 7/1999 Tien et al. ................... 365/233

FOREIGN PATENT DOCUMENTS

JP 7-140207 6/1995

* cited by examiner

Primary Examiner—David Nelms
Assistant Examiner—VanThu Nguyen
(74) Attorney, Agent, or Firm—Leydig, Voit, & Mayer, Ltd.

(57) ABSTRACT

A synchronous semiconductor memory device in a test mode of operation receives an external clock signal and is controlled by an internal clock adjustment circuit producing an internal clock signal of high frequency to provide write and read operations. A clock cycle converter circuit included in the internal clock adjustment circuit included in the internal clock adjustment circuit produces the internal clock signal by performing a hierarchical exclusive-OR operation on a specific pair of two of eight clock signals successively delayed in phase with respect to the external clock signal.

12 Claims, 17 Drawing Sheets

SYNCHRONOUS SEMICONDUCTOR INTEGRATED CIRCUIT DEVICE CAPABLE OF TEST TIME REDUCTION

BACKGROUND OF THE INVENTION

1. Field of the Invention

The present invention relates to semiconductor integrated circuit devices and in particular to a semiconductor integrated circuit device operating synchronously with an external clock signal. More specifically, the present invention relates to e.g. a synchronous semiconductor memory device operating synchronously with an external clock signal.

2. Description of the Background Art

With the recent improvement in the operating speed of microprocessors (MPUs), synchronous DRAM (SD and the like operating synchronously with a clock signal have been used to achieve rapid access to dynamic random access memory (DRAM) and the like used as a main memory device.

The operating speed of recent semiconductor integrated circuit devices other than the SDRAM described above have also been significantly improved with the improvement of the microfabrication technology, designing technology and the like therefor.

During the process for manufacturing semiconductor integrated circuit devices such as DRAMs or prior to shipping the products, a so-called tester device is used to estimate the electrical characteristics of the products to determine whether the products are defective and ensure their reliability.

However, the improvement in the operating speed of the SDRAM and the like described above also requires the operating speed of the tester device to be improved to correspond to the operating speed of the device to be tested and this tends to increase the testing cost.

3. Description of the Background Art

FIG. 21 is a schematic block diagram showing an entire configuration of a conventional SDRAM 2000 having a capacity of 1 G bit.

SDRAM 2000 includes: an internal control clock generation circuit 8 receiving an external clock signal ext.CLK via a clock input terminal 2 and a clock input buffer 4 and outputting an internal clock signal int.CLK; a mode decoder 22 receiving via input buffers 12 to 20 the control signals supplied via an external control signal input terminal 10 to output internal control signals; an input terminal 22 receiving a reference potential Vref for determining whether an input signal is of high level or low level; a mode register 46 responsive to an address signal supplied via an address signal input terminal 30 and to a control signal for setting and holding the information for an operation mode of SDRAM 2000, such as data on burst length; and a row address buffer/column address buffer 32–38 receiving address signals A0 to A12 supplied via address signal input terminal 30 and controlled by mode decoder 22 to respectively receive a row address and a column address supplied in time division manner.

SDRAM 2000 also includes: a self-refresh timer 54 controlled by mode decoder 22 to output a clock controlling a self-refresh operation while a self-refresh mode is set; a refresh address counter 56 controlled by self-refresh timer 54 to output an address signal provided during a self-refresh period; a multiplexer 58 receiving an output from refresh address counter 56 and an output from row address buffer 32–38 and selectively outputting the output from row address buffer 32–38 during a normal operation and the output from refresh address counter 56 during the period of the self-refresh mode; a bank address buffer 51 receiving bank addresses BA0 to BA2 supplied via address signal input terminal 30; a bank decoder receiving an output from bank address buffer 51 and outputting a designated bank address; a row predecoder 62 predecoding a row address in a designated bank; a burst address counter 60 receiving an output from column address buffer 51 and outputting a burst address depending on a set burst length while a burst mode is designated; and a column predecoder 64 receiving an output from burst address counter 60 and predecoding a column address in a selected bank.

SDRAM 2000 also includes: memory array blocks 100, 110, ..., 120 respectively corresponding to banks 0 to 7; row decoders 102, 112, ..., 122 respectively provided for the memory array blocks or banks, responsive to an output from bank decoder 66 and an output from row predecoder 62 for selecting a row in their respective banks; column decoders 104, 114, ..., 124 provided for their respective banks, receiving an output from column predecoder 64 to select a column in their respective banks; input/output circuits 106, 116, ..., 126 provided for their respective banks, supplying read data to a global I/O bus G-I/O and supplying written data from global I/O bus G-I/O to their respective memory array blocks; a read/write register 84 holding written data supplied to the global I/O bus and read data transferred from the global I/O bus; and a data input/output terminal 70 provided for read/write register 84 via bidirectional input/output buffers 72 to 82 for externally transmitting and receiving input/output data DQ0 to DQ31.

FIG. 22 are timing charts for representing an operation of the conventional SDRAM 2000 shown in FIG. 21.

It is assumed that at time t0 (not shown) when external clock signal ext.CLK rises, signals /CS and /RAS that each attain an active low level and an activated bank address that is designated activates the operation of the corresponding bank.

Furthermore, in response to an address signal supplied at time t0 an operation is effected to select the corresponding row.

Then, at time t1 when external clock signal ext.CLK rises, a write operation is designated in response to signals /CS, /CAS and /WE of active low level. In response to an address signal supplied at time t1, data are successively written (or a burst write operation is effected). More specifically, a signal WRITE indicative of the write operation in SDRAM 2000 attains an active high level and burst address counter 60 also outputs an internal address int.ADD depending on the designated burst length.

Responsively the written data supplied at a data input/output terminal DK at time T1 is latched by write register 84 provided in SDRAM 2000 and is transmitted to a selected memory array block via a global I/O bus D/I/O. The written data, transmitted via an I/O line pair M-I/O in the memory array block, is transmitted to a bit line pair BL in response to that column select signal YS corresponding to a memory cell column selected in response to internal address signal int.Add which is activated synchronously with a write clock signal WCLK generated in SDRAM 2000.

Responsively, the data is written in a selected memory cell.

Thereafter, the data supplied to data input/output terminal DK successively at times t2, t3 and t4 are similarly written in memory cells successively selected.

For a read operation, signals /CS and /RAS that are activated at time t6 (not shown) when external clock signal ext.CLK rises, activate a bank selected in response to a bank address signal.

Then at time t7 when external clock signal ext.CLK rises, the read operation is designated in response to signals /CS and /CAS of active low level, and in response to an address signal supplied at time t7 an operation is effected for selecting the corresponding column. In response to the address signal supplied at time t7, burst address counter 60 successively outputs burst addresses for a designated burst length of e.g. four.

In SDRAM 2000, in response to a read clock signal RCLK described a corresponding memory cell is selected and the data read is read via I/O line pair M-I/O and global I/O bus G-I/O and held in read write register 84. The read data corresponding to a column address supplied at time t7 is output to data input/output terminal DQ at time t9.

Thereafter, similarly the data read from the burst addresses designated by burst address counter 60 are supplied to data input/output terminal DQ at times t10, t11 and t12 successively.

With the write and read operations of conventional SDRAMs effected as described above, increasing the frequency for effecting a test operation of SDRAM 2000 requires increasing an external clock frequency generated at the tester. This not only complicates the configuration of the tester but requires an expensive tester device.

In other words, there has been a disadvantage that the testing cost is increased in the process for manufacturing SDRAM 2000.

SUMMARY OF THE INVENTION

An object of the present invention is to provide a synchronous semiconductor integrated circuit device capable of reducing a testing cost associated with improvement in the operating speed of a device to be tested.

To sum up, the present invention is a synchronous semiconductor integrated circuit device operating in response to an external clock signal, externally receiving a control signal and externally transmitting and receiving data, the synchronous semiconductor integrated circuit device including an internal synchronization signal generation circuit, an internal circuit and a data input/output circuit.

The internal synchronization signal generation circuit is controlled by the control signal to generate in a first operation mode an internal clock signal corresponding to the external clock signal and in a second operation mode an internal clock signal activated in synchronization with activation of the external clock and also attaining an active state N times during one cycle of the external clock, wherein N is a natural number and larger than two.

The internal circuit is controlled by the control signal and synchronized with the internal clock signal to apply a predetermined process to the external data.

The data input/output circuit is synchronized with the internal clock signal to output the data from the internal circuit.

Therefore a main advantage of the present invention is that since the internal circuit in the second operation mode operates in synchronization with an internal clock signal which attains an active state N times during one cycle period of the external clock signal, a test operation provided in the second operation mode allows reduction of testing time and hence testing cost.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
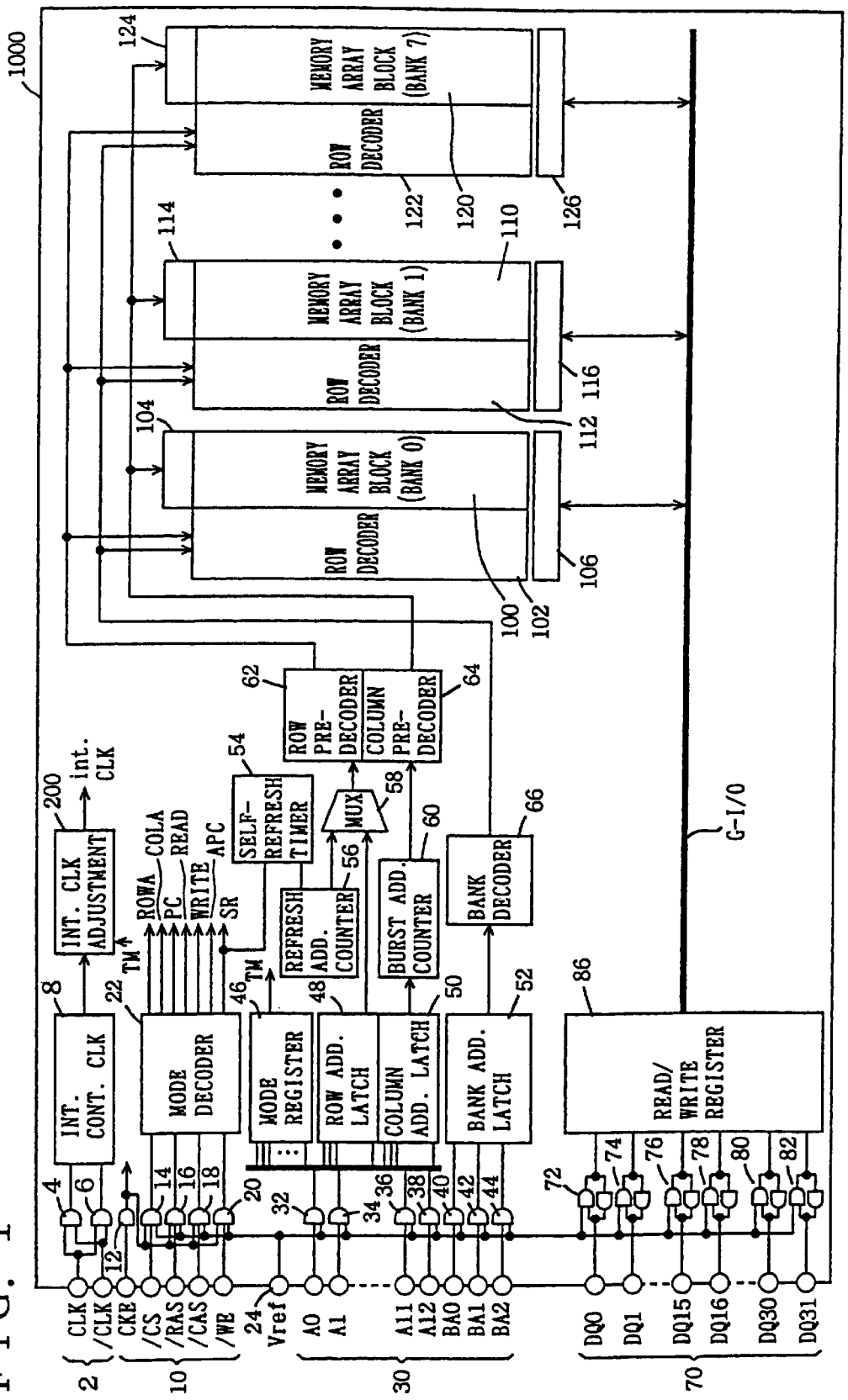
FIG. 1 is a schematic block diagram showing a configuration of a synchronous semiconductor memory device 1000 according to a first embodiment of the present invention.

FIG. 1 is a schematic block diagram showing a configuration of a synchronous semiconductor memory device 1000 according to a first embodiment of the present invention.

SDRAM 1000 includes: an external clock signal input terminal 2 receiving complementary clock signals ext.CLK and ext./CLK applied externally; clock input buffers 4 and 6 buffering the clock signals supplied to external clock terminal 2; an internal control clock signal generation circuit 8 receiving outputs from clock buffers 4 and 6 to generate an internal control clock signal; an internal clock adjustment circuit 200 which receives the internal clock signal to output the output from internal control clock generation circuit 8 as an internal clock signal int.CLK in a normal operation mode and to respond to the internal control clock signal in a test mode operation to output an internal clock signal int.CLK higher in frequency than the internal control clock signal; and a mode decoder 22 receiving via input buffers 12 to 20 an external control signals supplied via an external control signal input terminal 10.

External control signal input terminal 10 receives a signal CKE, a chip select signal /CS, a row address strobe signal /RAS, a column address strobe signal /CAS, and a write control signal /WE. Signal CKE is a signal for indicating that inputting a control signal to a chip is allowed. Without activating this signal, inputting a control signal is not permitted and SDRAM 1000 does not operate.

Signal /CS is a signal for determining whether a command signal is input. At a rising edge of the clock signal with signal /CS attaining an active low level, a command is determined depending on a combination of the levels of the other control signals.

Signal /RAS is a signal for indicating an operation of row-associated circuitry and signal /CAS is a signal for indicating activation of an operation of column-associated circuitry. Signal /WE is a signal for determining whether an operation is the write operation or the read operation.

Mode decoder 22 responds to the external control signals to output internal control signals for controlling an operation of an internal circuit of SDRAM 1000. Mode decoder 22 outputs e.g. signals ROWA, COLA, ACD, PC, READ, WRITE, APC and SR as the internal control signals. Signal ROWA is a signal indicating that a row-related access is effected- Signal COLA is a signal indicating that a column-related access is effected. Signal ACT is a signal indicative of word-line activation.

Signal PC is a signal indicative of a precharge operation to indicate the end of an operation of the row-associated circuitry. Signal READ is a signal for indicating the read operation for the column-associated circuitry. Signal WRITE is a signal for indicating the write operation for the column-associated circuitry.

Signal APC indicates an auto-precharge operation. When a burst cycle ends with the auto-precharge operation designated, a precharge operation starts automatically. Signal SR is a signal for indicating a self-refresh operation. With the initiation of the self-refresh operation a self-refresh timer operates, and then when a predetermined time elapses, a word line is activated to initiate a refresh operation.

SDRAM 1000 also includes a self-refresh timer 54 starting to operate when signal SR designates a self-refresh mode, for indicating that the refresh operation is initiated or a word line is activated when a predetermined time has elapsed since the initiation of the operation of self-refresh timer 54, and a refresh counter 56 responsive to the indication from self-refresh timer 54 for generating an address subject to the refresh operation.

SDRAM 1000 also includes: a reference potential input terminal 22 receiving a signal VREF serving as a reference for determining whether an input signal is of high level or low level; a mode register 46 which holds the information for a predetermined operation mode depending on a combination of an address signal supplied via address signal input terminal 30 and the external control signal described above, such as the data on burst length, the information on whether the test mode has been designated, as will be described hereinafter; a row address latch 48 receiving an address signal via address signal input buffers 32 to 38 and holding an input row address at the timing at which the row address is input; a column address latch 50 receiving address signals A0–A12 and holding a column address at the timing at which the column address is input; a multiplexer 58 receiving an output from refresh address counter 56 and an output from row address latch 48 and selectively outputting the output from row address latch 48 in the normal operation and the output from refresh address counter 56 during the self-refresh operation; a row predecoder 62 receiving an output from multiplexer 58 for predecoding a row address; a burst address counter 60 referring to the column address held in column address latch 50 to generate an internal column address depending on the burst length data from mode register 46; a column predecoder 64 receiving an output from burst address counter 60 and predecoding a corresponding column address; a bank address latch 52 receiving via input buffers 40–44 bank addresses BA0–BA2 supplied to the address input terminal and holding a designated bank address value; a bank decoder 66 receiving an output from bank address latch 52 and decoding a bank address; memory array blocks 100, 110, . . . , 120 operating as banks 0–7, each being a unit independently capable of the read/write operation; row decoders 102, 112, . . . , 122 responsive to an output from bank decoder 66 and an output from row predecoder 62 for selecting a row or word line in their respective banks; column decoders 104, 114, . . . , 124 responsive to an output from column predecoder 64 for selecting a column or bit line pair in their respective banks; I/O ports 106, 116, . . . , 126 supplying on global L/O bus G-I/O the data read from a selected memory cell in a selected bank in the read operation and supplying the written data transmitted on bus G-I/O to their respective banks in the write operation; a read/write register 86 which in the write operation holds externally supplied written data and supplies the externally supplied written data to bus G-I/O and in the read operation holds the read data transmitted from bus G-I/O; and bidirectional input/output buffers 72–82 for communicating input/output data DQ0–DQ31 between read/write register 86 and data input/output terminal 70.

Figure 2:
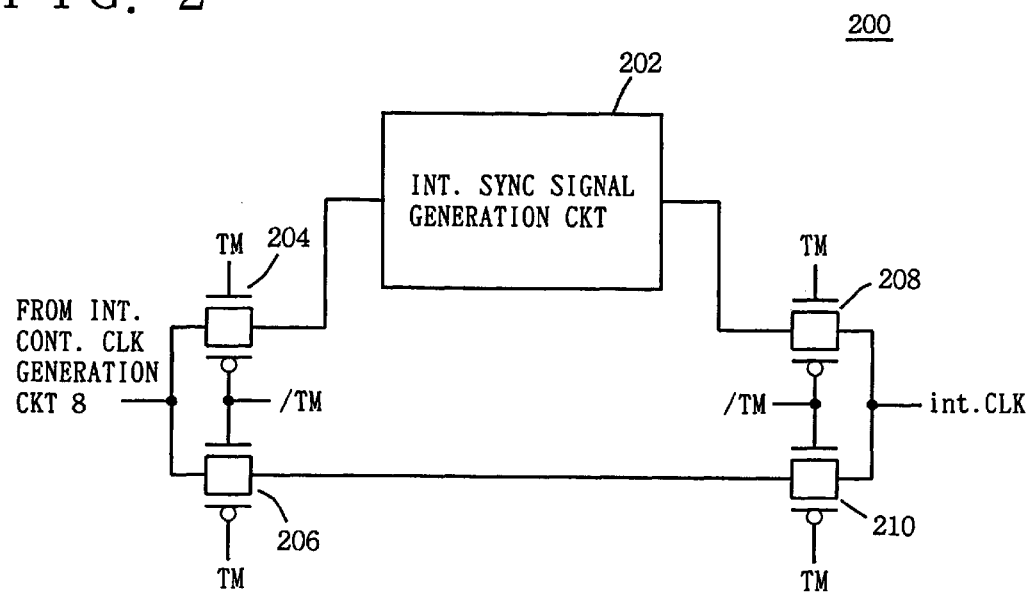
FIG. 2 is a schematic block diagram showing a configuration of the internal clock adjustment circuit 200 shown in FIG. 1.

FIG. 2 is a schematic block diagram showing a configuration of internal clock adjustment circuit 200 shown in FIG. 1.

Internal clock adjustment circuit 200 includes: a transmission gate 204 receiving an output from internal control clock generation circuit 8 and controlled by a test mode signal TM output from mode register 46 to turn on while the test mode is designated or signal TM is of high level and signal /TM is of low level; a transmission gate 206 receiving the output from internal control clock generation circuit 8 and turning on while signal TM is of inactive low level; an internal synchronization signal generation circuit 202 receiving an output from transmission gate 204 and generating an internal clock signal higher in frequency than the external clock signal; a transmission gate 208 receiving an output from internal synchronization signal generation circuit 202 and outputting the output from internal synchronization signal generation circuit 202 as an internal clock signal int.CLK while signal TM is activated; and a transmission gate 210 outputting an output from transmission gate 206 as internal clock signal int.CLK while signal TM is inactivated.

In other words, while the test mode is designated, internal clock adjustment circuit 200 outputs as internal clock signal int.CLK a clock signal higher in frequency than external clock signal ext.CLK that is generated by internal synchronization signal generation circuit 202. When signal TM is inactive, internal clock adjustment circuit 200 outputs as internal clock signal int.CLK a signal having the same frequency as external clock signal ext.CLK output from internal control clock generation circuit 8.

It should be noted that internal synchronization signal generation circuit 200 may be e.g. a phase locked loop (PLL) circuit combined with a frequency divider to generate a frequency N times that of external clock signal ext.CLK that corresponds to a frequency-dividing ratio N with respect to the frequency of external clock signal ext.CLK, wherein N is a natural number, or internal synchronization signal generation circuit 200 can be configured based on a DLL circuit to generate an internal clock signal int.CLK N times greater in frequency than external clock signal ext.CLK, as will be described hereinafter.

Figure 3:
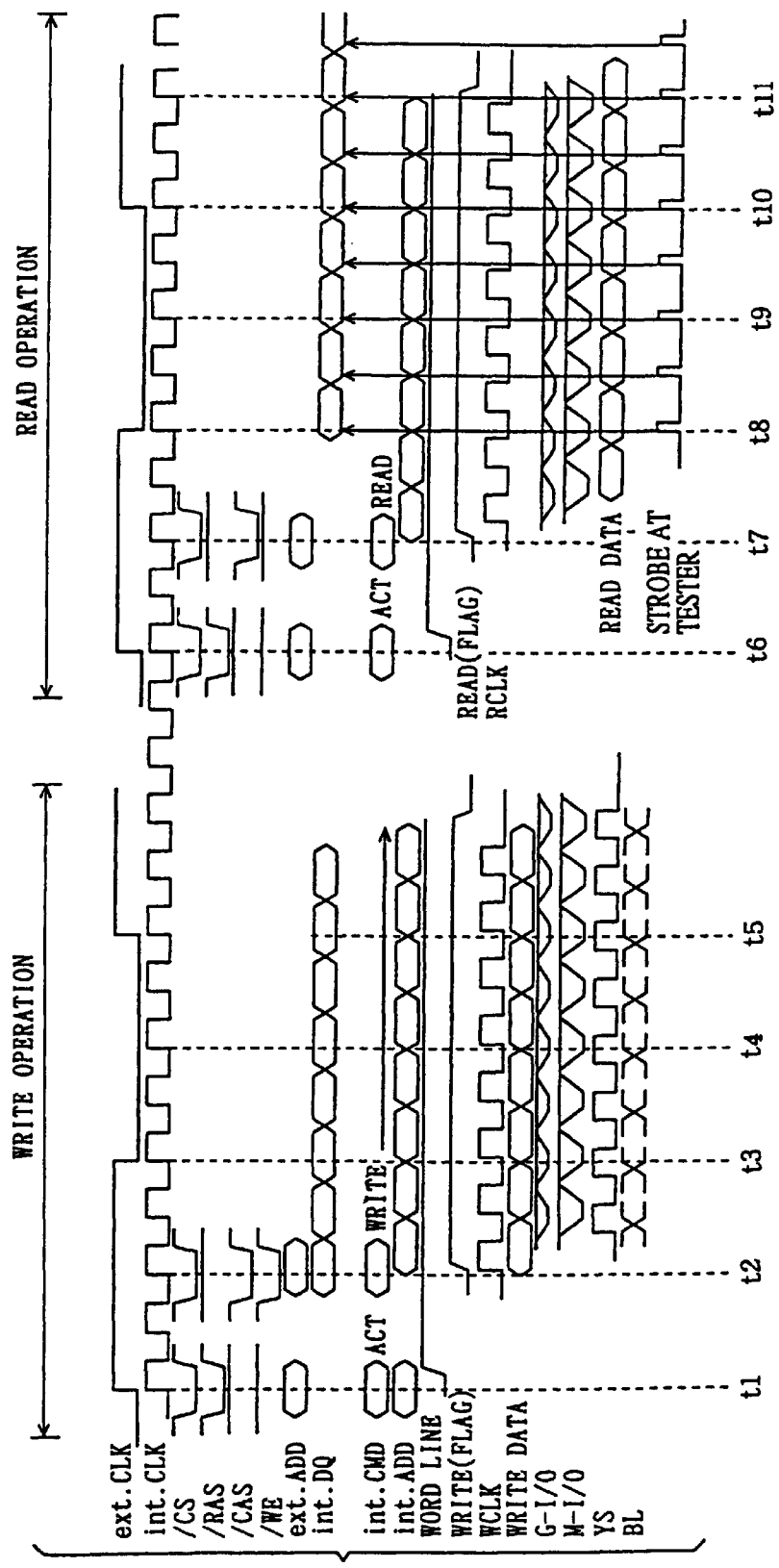
FIG. 3 is timing charts for representing an operation of SDRAM 1000.

FIG. 3 shows timing charts for schematically representing an operation of the FIG. 1 SDRAM 1000 in the test mode.

It is assumed that internal clock adjustment circuit 200 in SDRAM 1000 generates an internal clock signal int.CLK eight times greater in frequency than external clock signal ext.CLK generated by an external tester.

More specifically, if the clock supplied by the external tester has a frequency of approximately 20 MHz, internal clock signal int.CLK in SDRAM 1000 has a frequency of approximately 160 MHz for operation. This allows a margin test to be rapidly conducted using an inexpensive tester. Furthermore, the test time can also be significantly reduced since the internal circuitry of SDRAM 1000 operates rapidly.

Referring to FIG. 3, at time t1 when external clock signal ext.CLK rises, activation of the SDRAM is indicated in response to activated signals /CS and /RAS. It is assumed that prior to time t1, the test mode has been designated according to a level combination of a command signal (the external control signals) and an address signal.

At time t1 a row address is fed and held in row address latch 48. Then, at time t2 the write operation is designated in response to signals /CS, /CAS and /WE that are active at an activation edge of internal clock signal int.CLK. Meanwhile, a column address is also input and its value is held in column address latch 50. While in the operation at time t2 the external clock signal itself does not act as a trigger in inputting a command, a control signal can be activated at a rising edge of the internal clock to designate the write operation. In designating the write operation as described above, setting a burst-write mode of operation allows the write operations in the subsequent cycles to proceed with burst test counter 60 automatically incrementing a column address within SDRAM 1000.

By the designation of the write operation, signal WRITE as a flag signal for indicating an internal write operation attains an active state.

Thereafter, data that is externally changed according to a transition of a writing clock signal WCLK generated in SDRAM 1100 is fed to SDRAM 1000 in response to a using edge of internal clock WCLK. Thus the external tester is only required to change written data and the load thereon can be significantly reduced.

In the read operation, at time t6 command ACT for activating a word line is input in response to signals /CS and RAS that are active at a rising edge of external clock signal ext.CLK. At this time point, an address designating a word line is input simultaneously. Then at time t7 the read operation is designated in response to activated signals /CS and /CAS. Meanwhile a column address is designated and held in column address latch 50. Depending on the address held in column address latch 50, burst address counter 60 generates an internal address. A word line is activated and the data read from a selected memory cell and amplified by a sense amplifier is read synchronously with read clock RCLK generated in SDRAM 1000 and the data is held in read/write register 86 and output successively to data input/output terminal 70. In other words, while in this example the external clock does not act as a trigger in inputting a command, command data, address data and input/output data are supplied at rising points of the internal clock that are accompanied with activation of signal /CS indicative of command inputs so that a command signal and an address signal are incorporated in response to the low-to-high transitions of the internal clock. If a setting for a burst-read mode of operation is also set, the read operations after time t7 are provided with a column address internally incremented automatically.

It is assumed that the tester device receiving the read data is set to generate a strobe signal in an interleave operation. The strobe signal is generated to synchronize with external clock signal ext.CLK and have an activation period N times the cycle of external clock signal ext.CLK In this example, the tester generates a plurality of strobe signals in one cycle and SDRAM 1100 outputs read data in response to the internal clock signal. Thus, if the tester changes the strobe signal according to the cycle of the internal clock signal, read data and an expected value can be compared with each other.

In this example, the strobe signal generated at the tester is generated in accordance with the internal clock signal in SDRAM 1100. It should be noted, however, that since in this example it has been clear to the tester that internal clock signal int.CLK operates in the cycle of 1/N of external clock signal ext.CLK, the interleave operation (i.e. an operation which activates the strobe a plurality of times in one cycle) provided at the tester allows generation of the strobe signal described above.

In the interleave operation, a plurality of long-cycle waveforms are laid on one another to produce a short-cycle waveform.

In the description provided above, an SDRAM is used as an exemplary device to be tested. However, if the semiconductor integrated circuit device produces internal clock signal int.CLK N times greater in frequency than external clock signal ext.CLK, an operating-frequency margin test for a group of internal circuits can be simultaneously conducted using a low frequency tester. In other words, the test method as described above provides a method allowing an inexpensive low-frequency tester to be employed for testing an operation of SDRAMs as well as general semiconductor devices at high frequency.

Figure 4:
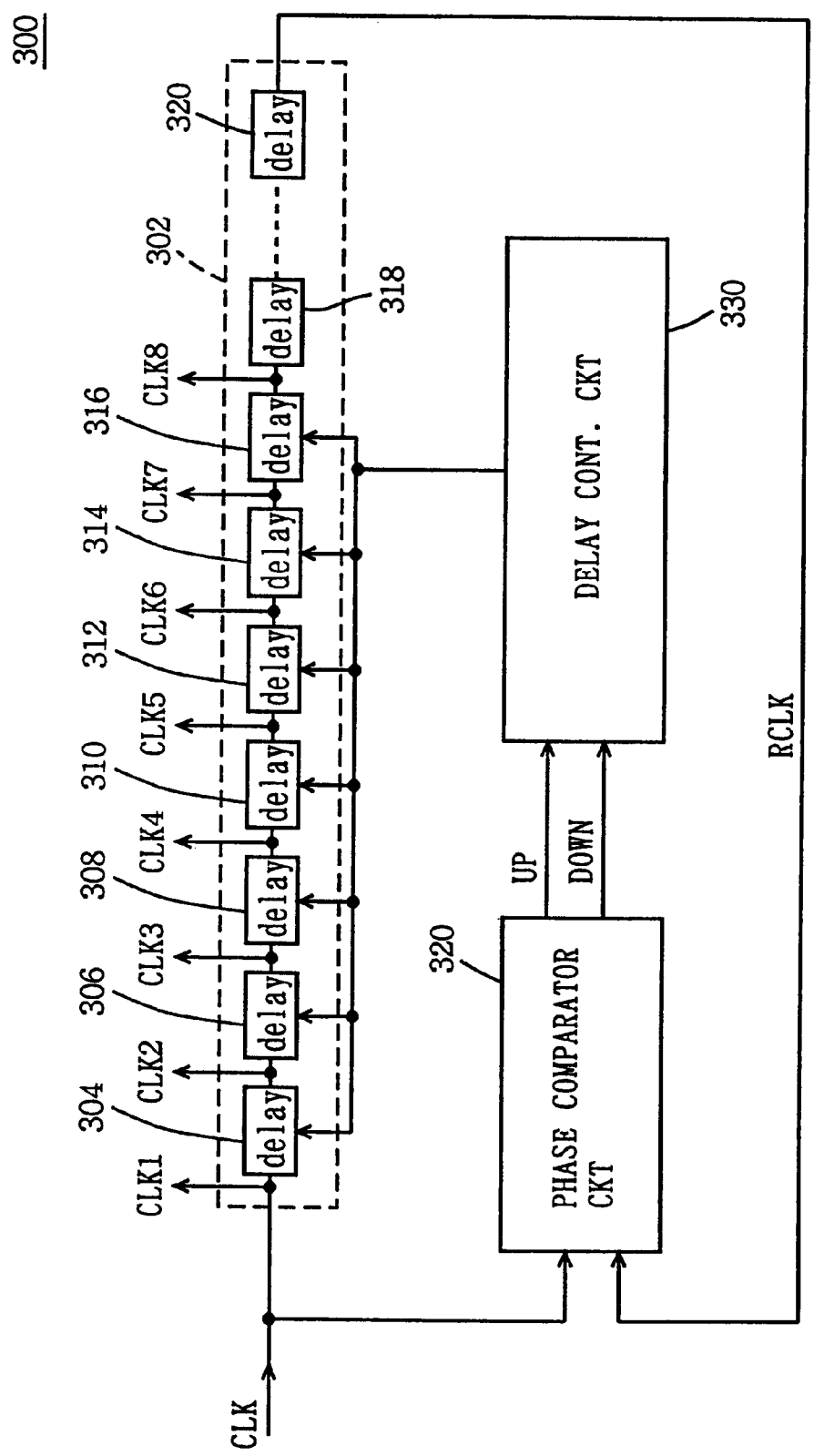
FIG. 4 is a schematic block diagram showing a configuration of a DLL circuit 300 included in internal clock adjustment circuit 200.

FIG. 4 is a schematic diagram showing a configuration of a DLL circuit included in the FIG. 2 internal synchronization signal generation circuit 202.

DLL circuit 300 includes: a variable delay circuit 302 receiving a clock signal CLK having the same cycle as the external clock signal that is supplied from internal control clock generation circuit 8 via transmission gate 204, and outputting clock signal CLK delayed by a delay time controlled by a delay control circuit 330 described hereinafter; a phase comparator circuit 320 comparing the phase of clock signal CLK and the phase of an output from delay circuit 302, and activating a signal UP if the phase of the output from variable delay circuit 302 delays as compared with that of signal CLK and activating a signal DOWN if the phase of the output from variable delay circuit 302 is advanced as compared with that of signal CLK; and delay control circuit 330 receiving signals UP and DOWN from the phase comparator circuit to control the delay time of delay circuit 302.

Variable delay circuit 302 also includes: delay circuits 304–316 connected in series, each having a delay time controlled by delay control circuit 330; and delay circuits 318–320 receiving and outputting an output from delay circuit 316 to phase comparator circuit 320. Between delay circuits 318 and 320 are connected nine delay circuits in series, including delay circuits 318 and 320, although they are not shown in the figure.

That is, variable delay circuit 302 includes 16 delay circuits 304–320 in total.

Hereinafter a signal supplied to an input node of variable delay circuit 302 is represented as a signal CLK1, a signal output from delay circuit 304 as a signal CLK2, and the signals respectively output from delay circuits 306–316 as signals CLK3–CLK8, respectively.

Figure 5:
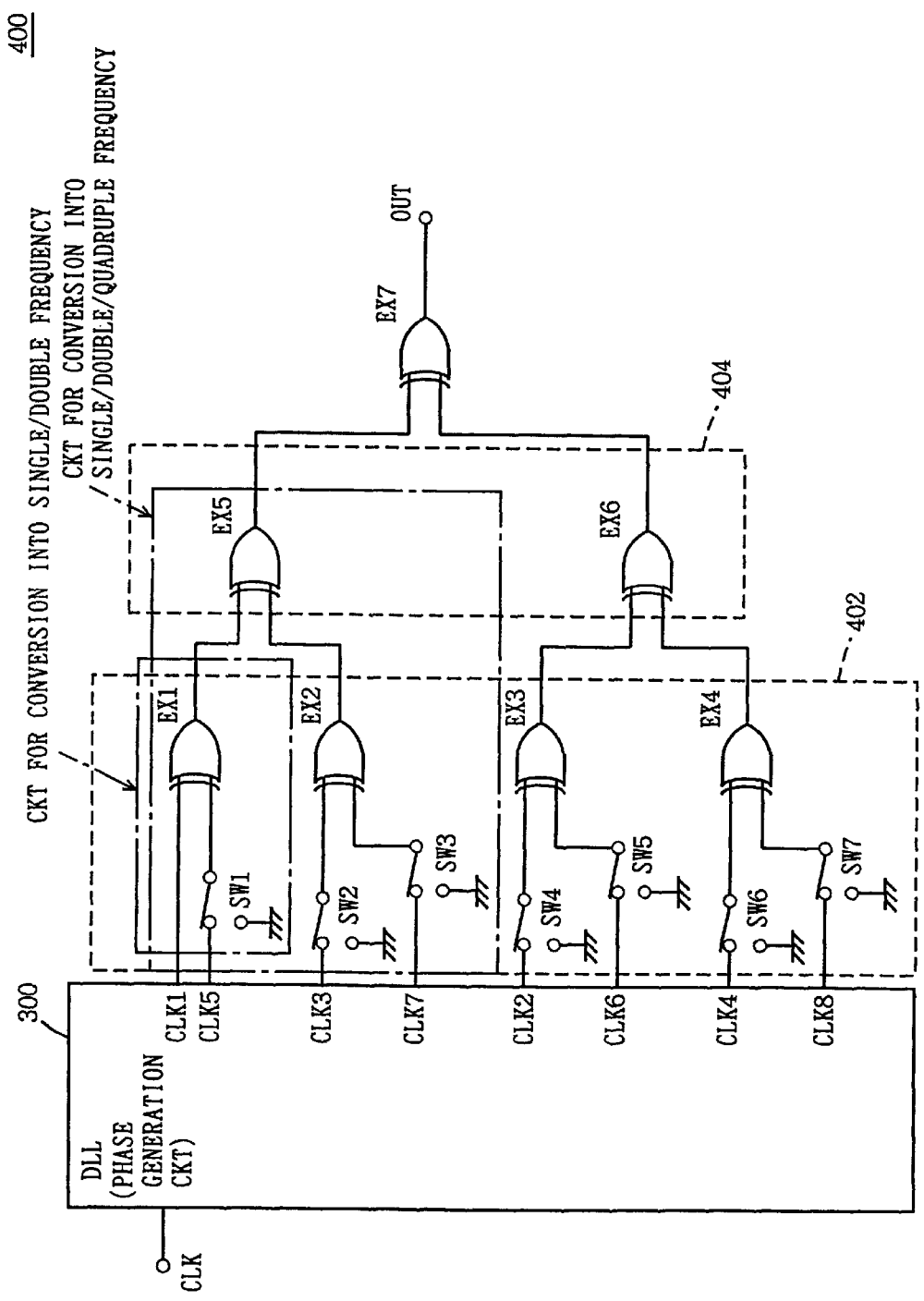
FIG. 5 is a schematic block diagram showing a configuration of a clock cycle conversion circuit 400 included in internal clock adjustment circuit 200.

FIG. 5 is a schematic block diagram showing a configuration of a clock cycle conversion circuit 400 responding to signals CLK1–CLK8 output from delay circuit 300 to output a clock signal that is synchronized with external clock signal ext.CLK and has a multiplied version of the frequency of external clock signal ext.CLK.

Hereinafter it is assumed that the signals output from variable delay circuit 302 and signal CLK are in perfect synchronization with each other or the sum of the delay times of delay circuits 304–320 corresponds to one cycle of clock cycle CLK.

In this example, the delay for each delay circuit is set at the delay time equal to $1/16$ of the cycle of signal CLK.

More specifically, signal CLK1 is the same in phase as signal CLK, signal CLK2 is delayed as compared with signal CLK by $1/16$ of the cycle of signal CLK, and similarly signal CLK1 (i=3 to 8) is delayed as compared with signal CLK by i/16 of the cycle of signal CLK.

Clock cycle conversion circuit 400 includes a first logical operation circuit 402 receiving signals CLK1–CLK8, a second logical operation circuit 404 receiving an output from the first logical operation circuit 402, and an exclusive-OR gate EX7 receiving an output from the second logical operation circuit 404 and outputting an internal clock signal having a converted clock cycle.

The first logical operation circuit 402 includes: a switch SW1 controlled depending on the cycle conversion data designated by mode register 46, to receive signal CLK5 and a ground potential; an exclusive-OR operation circuit EX1 receiving an output from SW1 and signal CLK1; a switch SW2 controlled depending on the cycle conversion data, to receive signal CLK3 and the ground potential; a switch SW3 controlled depending on the cycle conversion data, to receive signal CLK7 and the ground potential; an exclusive-OR operation gate EX2 receiving an output from switch SW2 and an output from switch SW3; a switch SW4 controlled depending on the cycle conversion data, to receive signal CLK2 and the ground potential; a switch SW5 controlled depending on the cycle conversion data, to receive signal CLK6 and the ground potential; an exclusive-OR gate EX3 receiving an output from switch SW4 and an output from switch SW5; a switch SW6 controlled depending on the cycle conversion data, to receive signal CLK4 and the ground potential; a switch SW6 controlled depending on the cycle conversion data, to receive signal CLK4 and the ground potential; a switch SW7 controlled depending on the cycle conversion data, to receive signal CLK8 and the ground potential; and an exclusive-OR gate EX4 receiving an output from switch SW6 and an output from switch SW7.

The second logical operation circuit 404 includes an exclusive-OR gate EX5 receiving an output from exclusive-OR gate EX1 and an output from exclusive-OR gate EX2, and an exclusive-OR gate EX6 receiving an output from exclusive-OR gate EX3 and an output from exclusive-OR gate EX4. Exclusive-OR gate Ex7 receives an output from exclusive-OR gate EX5 and an output from exclusive-OR gate EX6.

Figure 6:
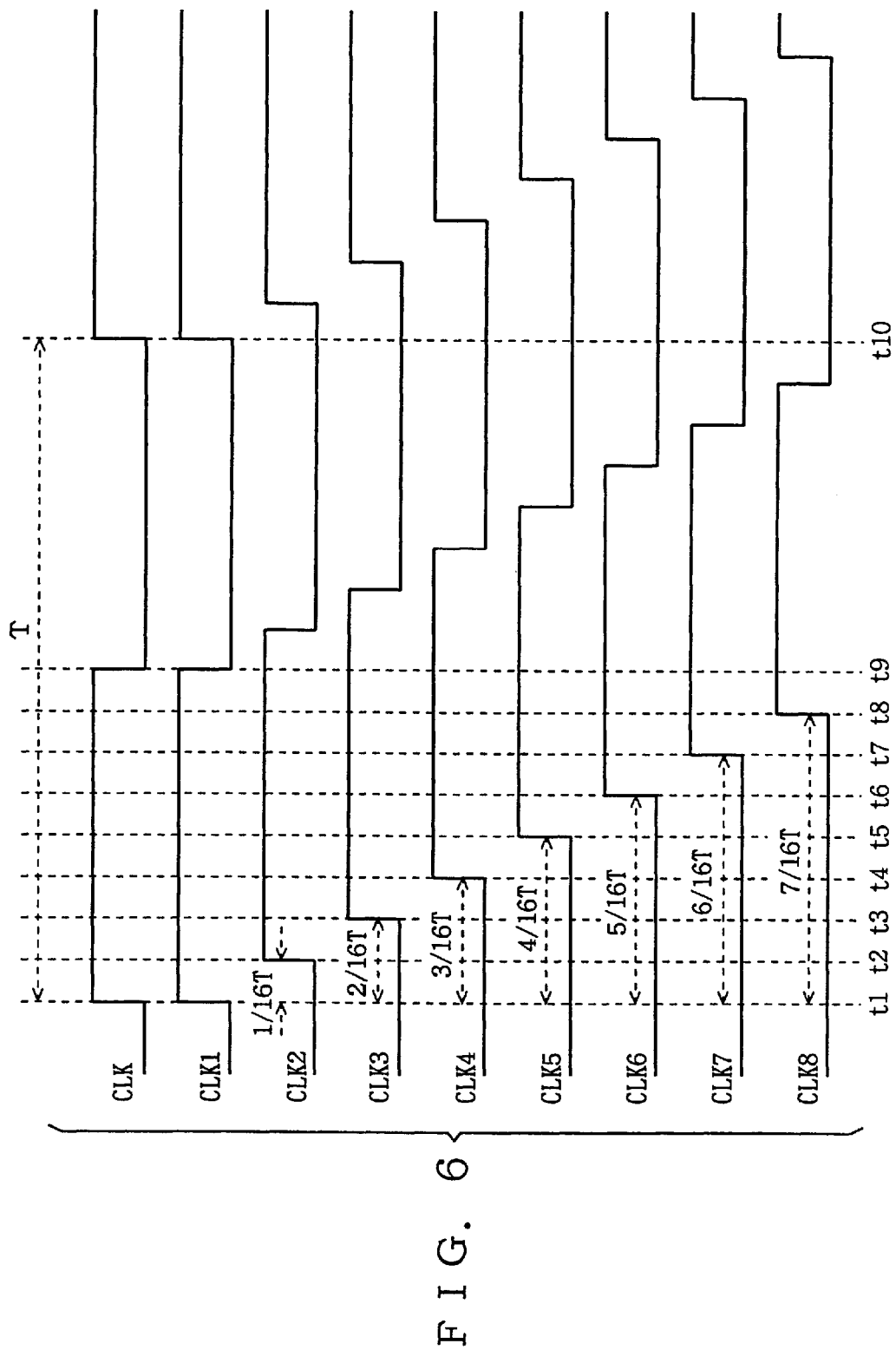
FIG. 6 is timing charts representing changes in clock signals CLK1 to CLK8 output from CDLL circuit 300.

FIG. 6 shows timing charts representing a waveform of each of signals CLK1–CLK8 indicated in FIGS. 4 and 5.

As has been described above, signal CLK1 is the same in phase as signal CLK, and signal CLKi is delayed as compared with signal CLK by i/16 T, wherein T represents the cycle of signal CLK.

Hereinafter a description is provided of an operation in which clock cycle converter circuit 400 produces from signal CLK having the same cycle as external clock signal ext.CLK an internal clock signal having $1/16$ of the cycle of signal CLK.

It is assumed in this example that switches SW1–SW7 are switched to select signals CLK2–CLK8, respectively.

Figure 7:
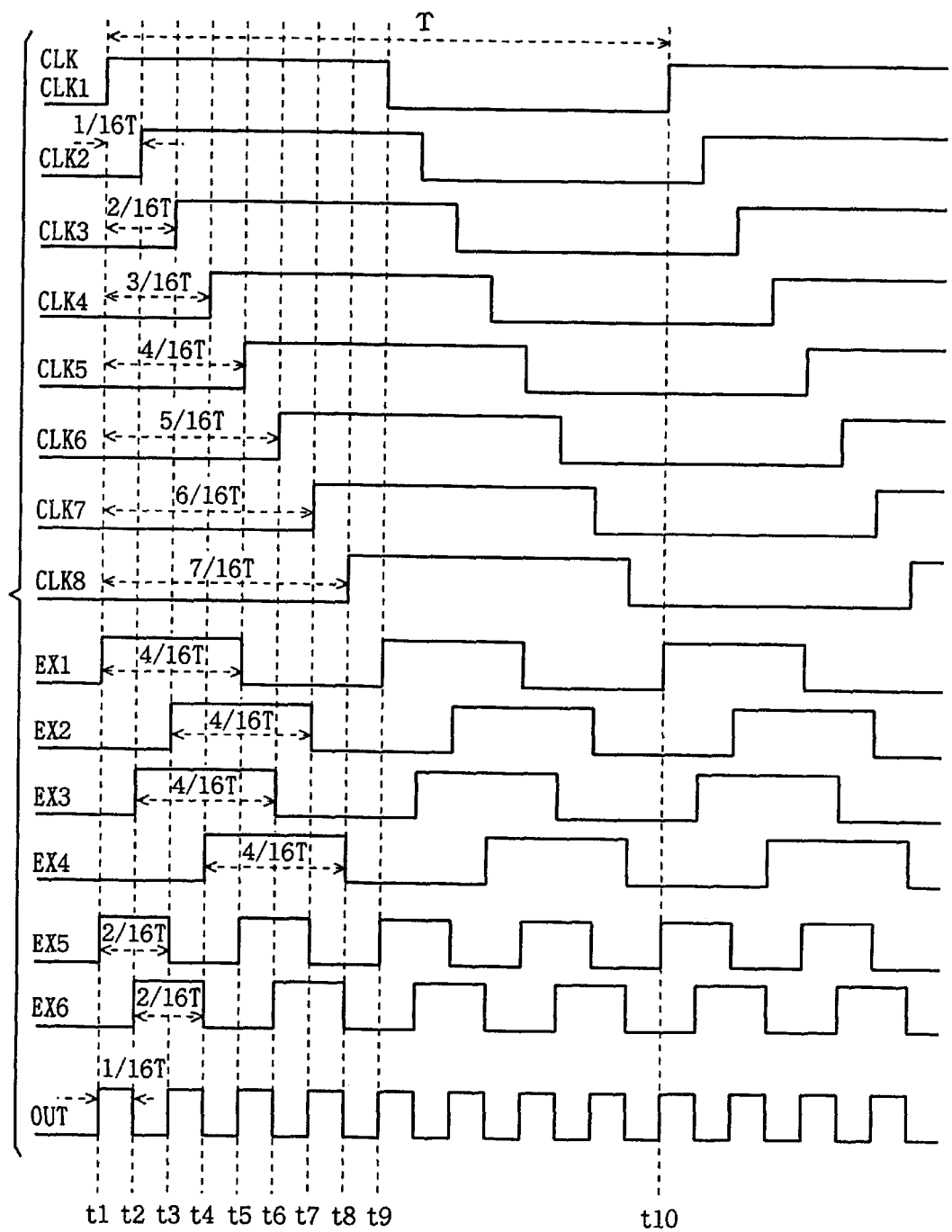
FIGS. 7–10 are first to fourth timing charts for representing operations of internal clock adjustment circuit 200 in a test mode.

In this example the signal output from exclusive-OR gate EX1 is an exclusive-OR of signals CLK1 and CLK5 and thus has a frequency twice that of signal CLK1 and is the same as signals CLK1 in the timing of activation, as represented in FIG. 7.

Meanwhile, the signal output from exclusive-OR gate EX1 has a cycle twice that of signal CLK and is delayed with respect to an activation edge of signal CLK by $1/8$ T.

The signal output from exclusive-OR gate EX3 has a cycle twice that of signal CLK and is delayed with respect to an activation edge of signal CLK by $1/16$ T.

The signal output from exclusive-OR gate EX4 has a frequency twice that of signal CLK and is delayed with respect to an activation edge of signal CLK by $3/16$ T.

The signal output from exclusive-OR gate EX5 is an exclusive-OR of an output signal from exclusive-OR gate EX1 and an output signal from exclusive-OR gate EX2, and thus has a frequency four times that of signal CLK and has an activation edge aligned with that of signal CLK, as shown in FIG. 7.

Meanwhile, the signal output from exclusive-OR gate EX6 is an exclusive-OR of an output from exclusive-OR gate EX3 and that from exclusive-OR gate EX4, and thus has a frequency four times that of signal CLK and is delayed with respect to an activation edge of signal CLK by $1/16$ T.

Thus the signal output from exclusive-OR gate EX7 is an exclusive-OR of an output from exclusive-OR gate EX5 and that from exclusive-OR gate EX6 and thus has a frequency eight times that of signal CLK and has an activation edge aligned with that of signal CLK, as represented in FIG. 7.

The above description is provided with respect to an operation producing an internal clock signal having a frequency eight times that of signal CLK.

Figure 8:
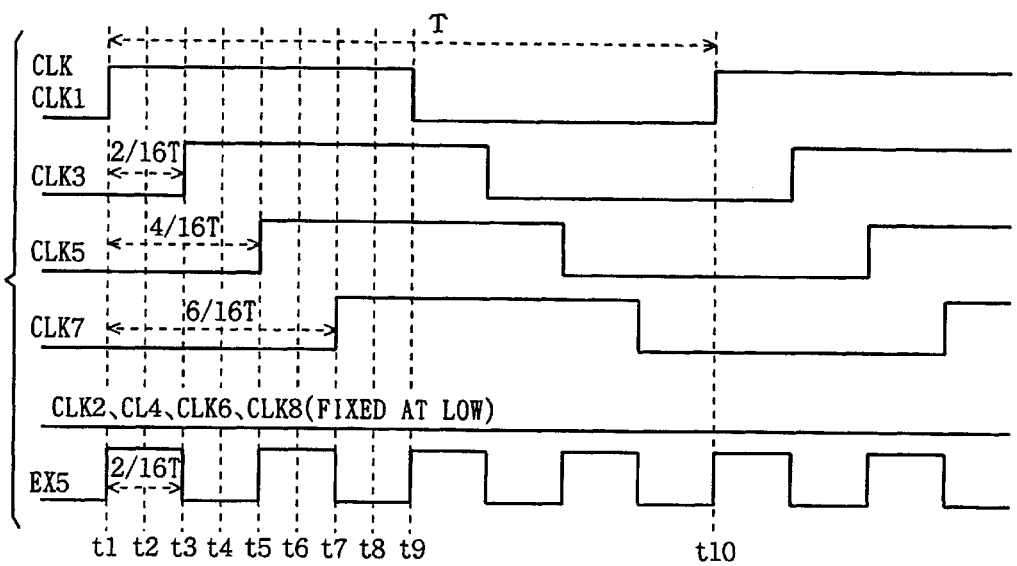

However, when a clock cycle conversion circuit 400 has e.g. switch circuits SW1, SW2, and SW3 set to respectively select clock signals CLK5, CLK3 and CLK7 and switch circuits CW4, SW5, SW6 and SW7 all set to select the ground potential, the level of the output from exclusive-OR gate EX6 is fixed at low level. Thus the signal output from exclusive-OR gate EX7 is identical to the signal output from exclusive-OR gate EX5. FIG. 8 shows a transition in level of the output from exclusive-OR gate EX5 or EX7 when switch circuits SW1–SW7 are set as described above. As is similar to the description provided with reference to FIG. 7, such a setting results in the output signal from exclusive-OR gate EX5 having a frequency four times that of signal CLK.

Figure 9:
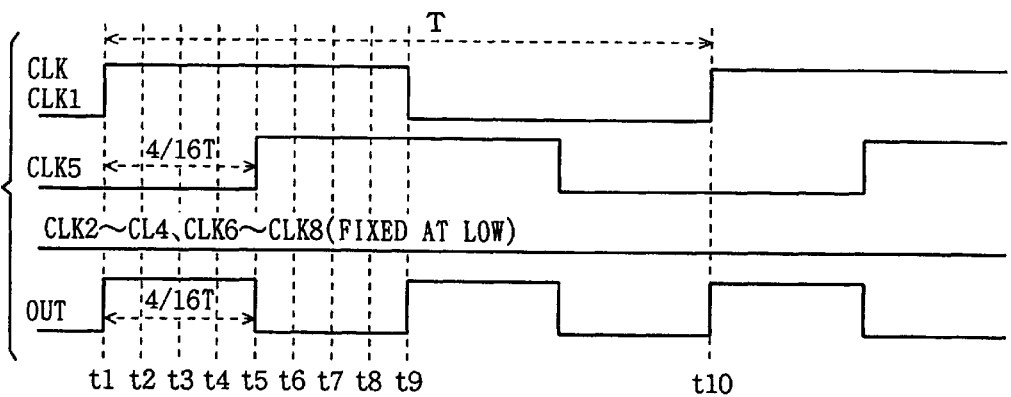

Similarly, FIG. 9 shows output waveforms when switch circuit SW1 is only set to select signal CLK5 and the other switch circuits SW2–SW7 are all set to select the ground potential level.

In this example the level of the output from exclusive-OR gate EX2 is also fixed at low level and the level of the output from exclusive-OR gate EX5 matches that of the output from exclusive-OR gate EX1. Meanwhile, the level of the output from exclusive-OR gate EX6 is also fixed at low level and the level of the signal OUT output from exclusive-OR gate EX7 thus matches that of the signal output from exclusive-OR gate EX1.

As shown in FIG. 9, the signal OUT in this example has a cycle twice that of signal CLK.

Figure 10:
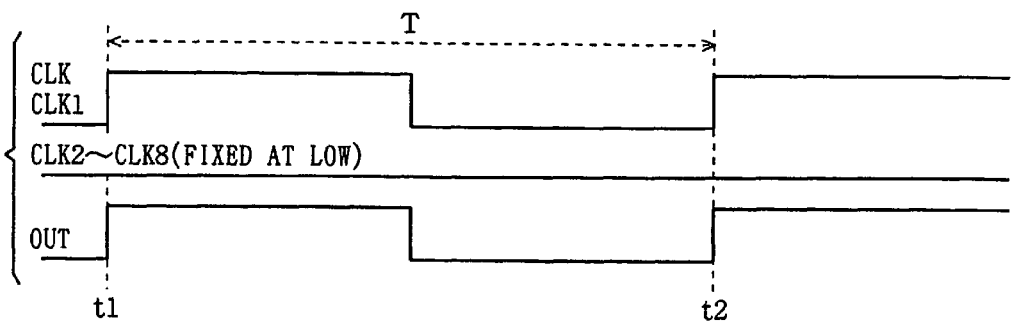

FIG. 10 shows output waveforms when switch circuits SW1–SW7 are all set to select the ground potential.

In this example, the output level of each of exclusive-OR gates EX2, EX3, EX4 and EX6 is fixed at low level. Furthermore, the level of the output from exclusive-OR gate EX1 is equal to that of signal CLK1. The respective output levels of exclusive-OR gates EX5 and EX7 are equal to that of exclusive-OR gate EX1 and the resultant output signal OUT thus has a level equal to that of signal CLK1.

Thus the output signal OUT in this example has a frequency equal to that of clock signal CLK1.

Thus, controlling the operation of switching switch circuits SW1–SW7 depending on the values set in mode register 46 allows generation of internal clock signal int.CLK having a frequency one to eight times that of an external clock signal.

If an internal clock signal is only required to have the frequencies equal to and twice greater than that of an external clock signal, there is only required a configuration having the exclusive-OR gate EX1 and switch circuit SW1 shown in FIG. 5. If an internal clock signal is required to have the frequencies one to four times that of external clock signal, there is only required a configuration having exclusive-OR gates EX1, EX2 and EX5 and switch circuits SW1, SW2 and SW3.

In general, if internal clock signal int.CLK is required to have a frequency N times that of external clock signal ext.CLK, the clock cycle conversion circuit can be configured of (N−1) exclusive-OR gate circuits and (N−1) switch circuits.

According to the configuration described above, a relatively simple circuit configuration allows generation of an internal clock signal synchronized with external clock signal ext.CLK and having a frequency equal to the external clock signal ext.CLK frequency multiplied by an integer.

It should be noted that in the description provided above, signals CLK1–CLK8 are produced by DLL circuit 300 for generating a signal synchronized with an external clock signal.

However, internal clock signal int.CLK can be produced with a simpler circuit configuration if the internal clock signal is only required to transition in a cycle shorter than that of the external clock signal and the internal clock signal is not necessarily required to have a waveform obtained by equally dividing the cycle of the external clock signal.

Seven delay circuits 304–316 connected in series, which receive a signal CLK having a cycle equal to that of the external clock signal, may respectively output signals CLK2–CLK8 while clock signal CLK may serve as signal CLK1.

Figure 11:
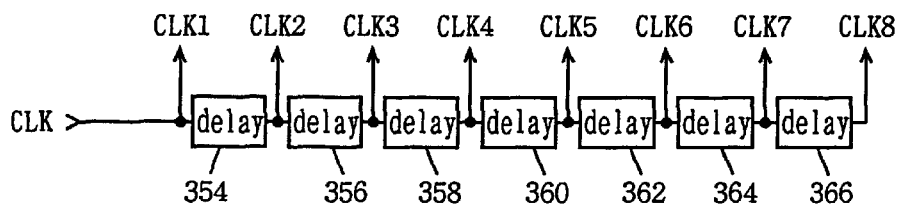
FIG. 11 is a schematic block diagram showing a configuration of a clock generation circuit 350 outputting clock signals CLK1 to CLK8.

A configuration of such a clock generation circuit 350 as described above is shown in FIG. 11. In this example, delay circuits 354–366 each provide a delay time which is not controlled with respect to the phase of the external clock signal. Thus delay circuits 354–366 each provide a fixed delay time.

In this example also, if delay circuits 354–366 each has a sufficiently short delay time, an internal clock signal which is activated eight times can be produced during one active period or one cycle period of external clock signal ext.CLK.

Such an internal clock signal allows a rapid data write operation and the like.

Figure 12:
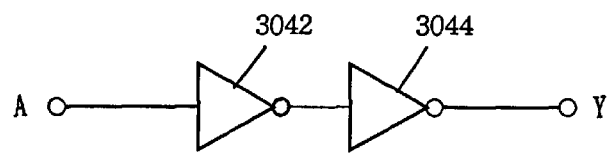
FIG. 12 is a schematic block diagram showing a configuration of a delay circuit 304.
Figure 13:
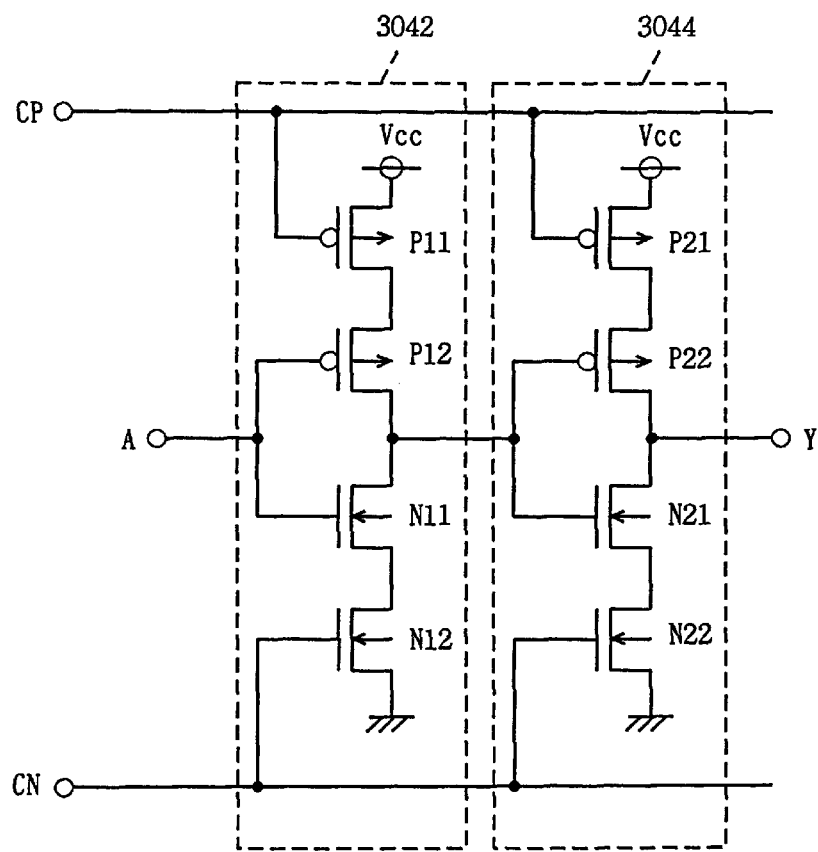
FIG. 13 is a circuit diagram showing the configuration of delay circuit 304.

FIG. 12 is a schematic block diagram showing a configuration of delay circuits 304–316 in the DLL circuit shown in FIG. 4, and FIG. 13 is a circuit diagram for more specifically illustrating the configuration of the delay circuit shown in FIG. 12.

As shown in FIG. 12, a representative delay circuit 304 is configured of inverters 3042 and 3044 in two stages that are connected in series.

As shown in FIG. 13, inverter 3042 includes p-channel MOS transistors P11 and P12 and n-channel MOS transistors N11 and N12 which are connected successively between a power supply potential Vcc and a ground potential. The gates of p- and n-channel MOS transistors P12 and N11 receive an input signal to delay circuit 304. The gate of p-channel MOS transistor P11 receives a control signal CP from delay control circuit 330 and the gate of n-channel MOS transistor N12 receives a control signal CN from delay control circuit 330. In other words, the value of the current supplied to inverter 3042 increases as the level of signal CP decreases. Similarly, the charge current supplied to inverter 3042 increases as the level of signal CN increases, and the level of the discharge current from inverter 3042 increases as the level of signal CN decreases.

That is, the operation speed of inverter 3042 improves as the level of signal CP decreases and the level of signal CN increases, and the operation speed of inverter 3042 decreases as the level of signal CP increases and the level of signal CN decreases.

Inverter 3044 has a configuration similar to that of inverter 3042.

Thus the delay time of delay circuit 304 is controlled depending on the levels of signals CP and CN from delay control circuit 330.

The configuration as has been described above allows SDRAM operating in synchronization with external clock signal ext.CLK in the normal operation to be operated according to an internal clock signal which is N times faster in frequency than external clock signal ext.CLK while an operation in the test mode is designated. Thus, if the frequency of the external clock signal is reduced in the test mode period, the operation of SDRAM 1000 can be tested so that the load on the tester and hence the testing cost can be reduced.

The testing-cost reducing effect can generally apply not only to a test operation for the SDRAM as described above but to that for semiconductor integrated circuit devices which operate in synchronization with external clock signal ext.CLK.

Second Embodiment

Figure 14:
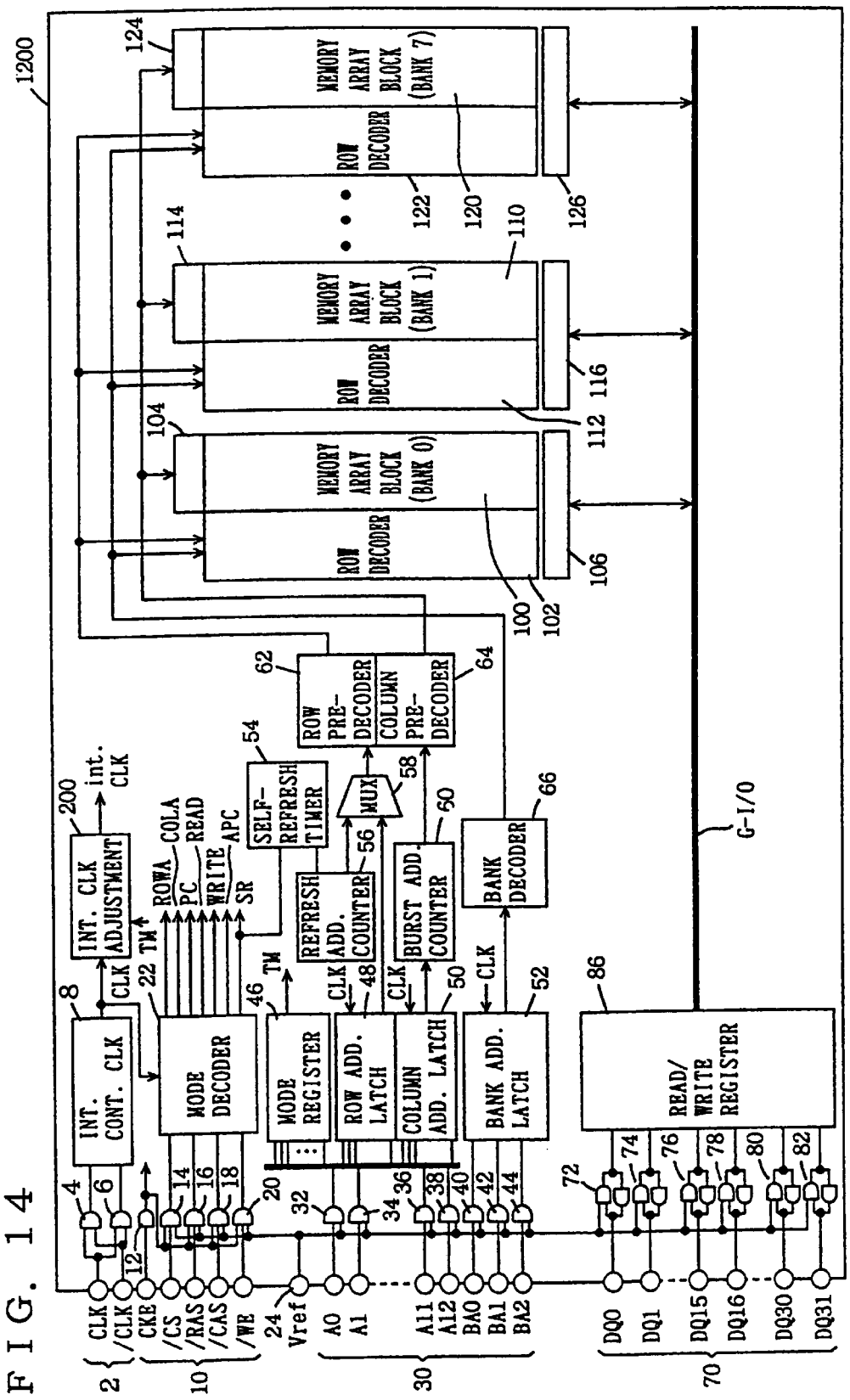
FIG. 14 is a schematic block diagram showing a configuration of a synchronous semiconductor memory device 1200 according to a second embodiment of the present invention.

FIG. 14 is a schematic block diagram showing a configuration of a SDRAM 1200 according to a second embodiment for the present invention.

The configuration of SDRAM 1200 is basically similar to that of SDRAM 1000 shown in FIG. 1.

Accordingly, the identical portions are labeled by the same reference characters and a description thereof will not be repeated.

The configuration of SDRAM 1200 differs from that of the FIG. 1 SDRAM 1000 according to the first embodiment in the control of synchronization operations with respect to a mode decoder and a mode register and in a data hold operation of read/write register 86.

More specifically, for SDRAM 1200 according to the second embodiment, the operation of feeding external control signals and address signals is effected synchronously with external clock signal ext.CLK, whereas the operation of writing data in a selected memory array block and the operation of reading data from a selected memory array block are controlled by internal clock signal int.CLK which is faster than external clock signal ext.CLK generated by internal clock adjustment circuit 200, as will be described hereinafter.

Figure 15:
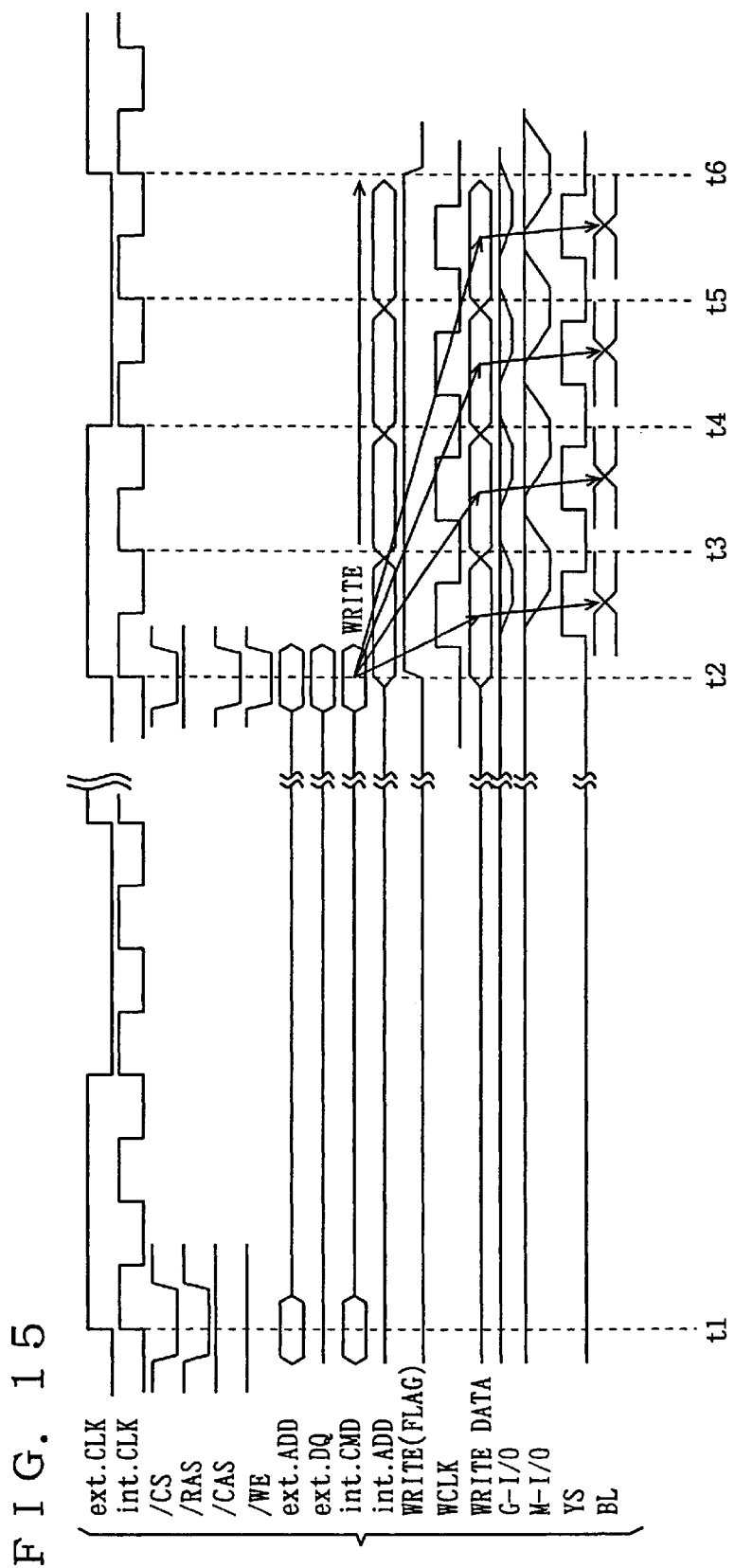
FIG. 15 is timing charts for representing a write operation of synchronous semiconductor memory device 1200.

FIG. 15 shows timing charts for representing the write operation in SDRAM 1200 shown in FIG. 14.

It is assumed that prior to time t1 a test mode is designated by a combination of a command signal and an address signal.

At time t1, a command ACT indicative of word-line activation is supplied in response to signals /CS and /RAS that are active at a rising edge of external clock signal ext.CLK. Simultaneously a row address is also supplied.

Then, at time t2, the write operation is designated in response to signals /CS, /CAS and /WE that are active at a rising edge of external clock signal ext.CLK. Simultaneously a column address is also designated and written data is also supplied to data input/output terminal 70. The supplied column address is fed to column address latch 50 and burst address counter 60 successively increments and thus outputs an internal address signal int.ADD depending on the preset burst length. Meanwhile, read/wrote register 86 holds the written data fed at time t2, and continues to output the same data to global I/O bus G-I/O during the burst-write period. For SDRAM 1200, in response to internal write clock signal WCLK having the same cycle as internal clock signal int.CLK and depending on the addresses successively output from burst address counter 60, the written data from global I/O bus G-I/O is transmitted to a main I/O line pair M-I/O running over a selected memory array block. In response to activation of a column select signal YS responding to internal address signal int.ADD to select a corresponding column, the written data is transmitted to the bit line pair corresponding to the selected column of memory cells. Thereafter, the written data supplied to data input/output terminal 70 at time t2, a time point at which a command indicative of the write operation is input, is repeatedly written in successively selected memory cells.

Thus, outputting command data, outputting address data and outputting written data are all only required to be synchronized with external clock signal ext.CLK. Thus the load on the tester device can further be reduced as compared with that on the tester device in the first embodiment.

In other words, the test operation can be effected using a tester device having simpler configuration.

Figure 16:
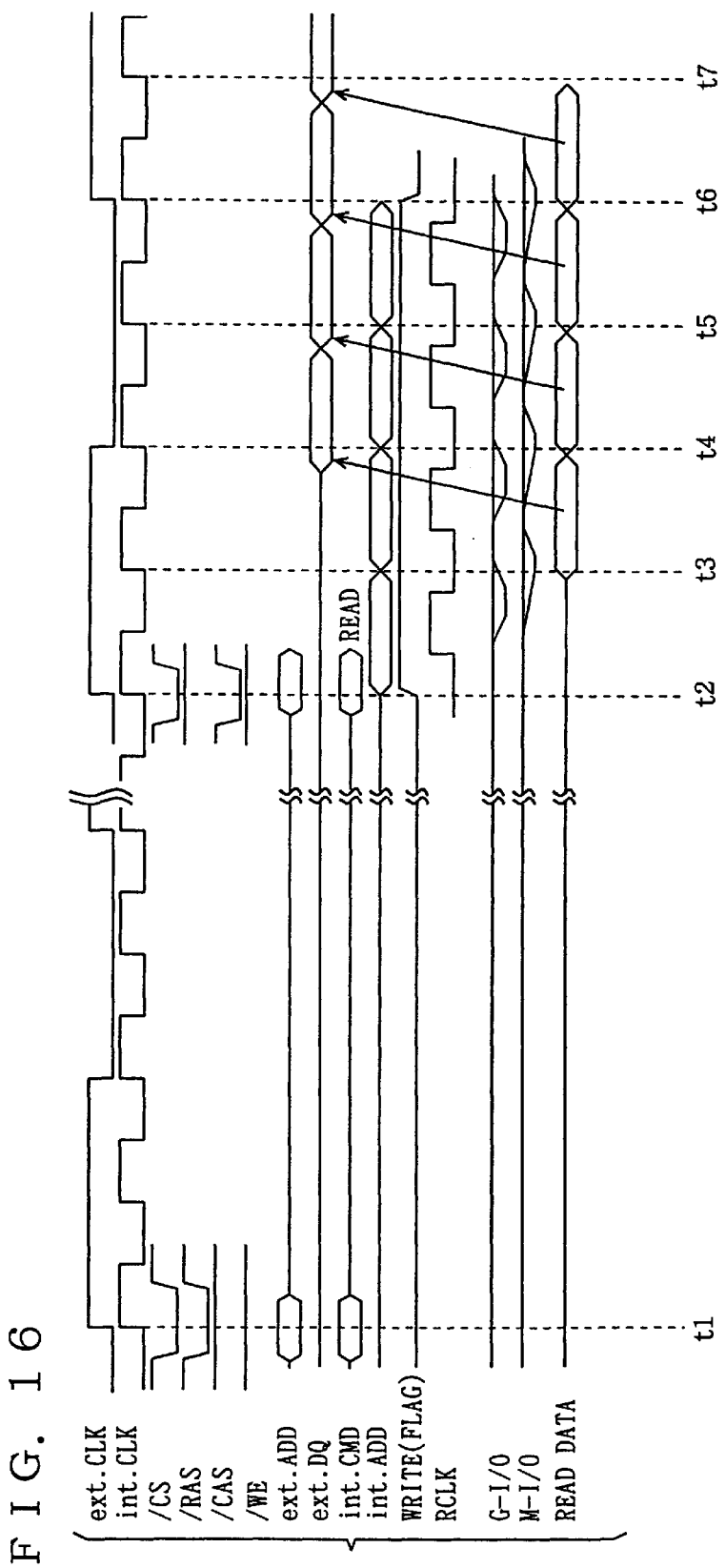
FIG. 16 is timing charts for representing a read operation of synchronous semiconductor memory device 1200.

FIG. 16 shows timing charts representing a read operation in the FIG. 14 SDRAM 1200 according to the second embodiment in the test mode.

It is also assumed in this example that the test mode is designated by a combination of a command signal and an address signal.

As is similar to the write operation represented in FIG. 15, a command ACT is supplied at time ti.

At time t2, the read operation is designated in response to signals /CS and /CAS that are active at a rising edge of external clock signal ext.CLK. Simultaneously, a column address for the reading operation is also supplied to SDRAM 1200. In response to designating the read operation at time t2, the burst address counter outputs internal address int.ADD depending on the preset burst length. Thereafter, the data which is read in response to activation of read clock RCLK generated in response to internal clock signal int.CLK in SDRAM 1200 and is amplified by a sense amplifier is transmitted via main I/O line pair M-I/O on the memory array and global I/O bus G-I/O to data input/output terminal 70. For the example represented in FIG. 16, successively reading data out to the external is started at time point t4, i.e. when the internal clock signal int.CLK cycle has elapsed since time t2.

In this example, such read data and an expected value can be compared be means of that strobe signal generated through an interleave operation at the tester which has a cycle twice that of the external clock signal.

Thus the load on the tester can be significantly reduced and a rapid operation test can be conducted using a simply configured and inexpensive tester device.

Third Embodiment

Figure 17:
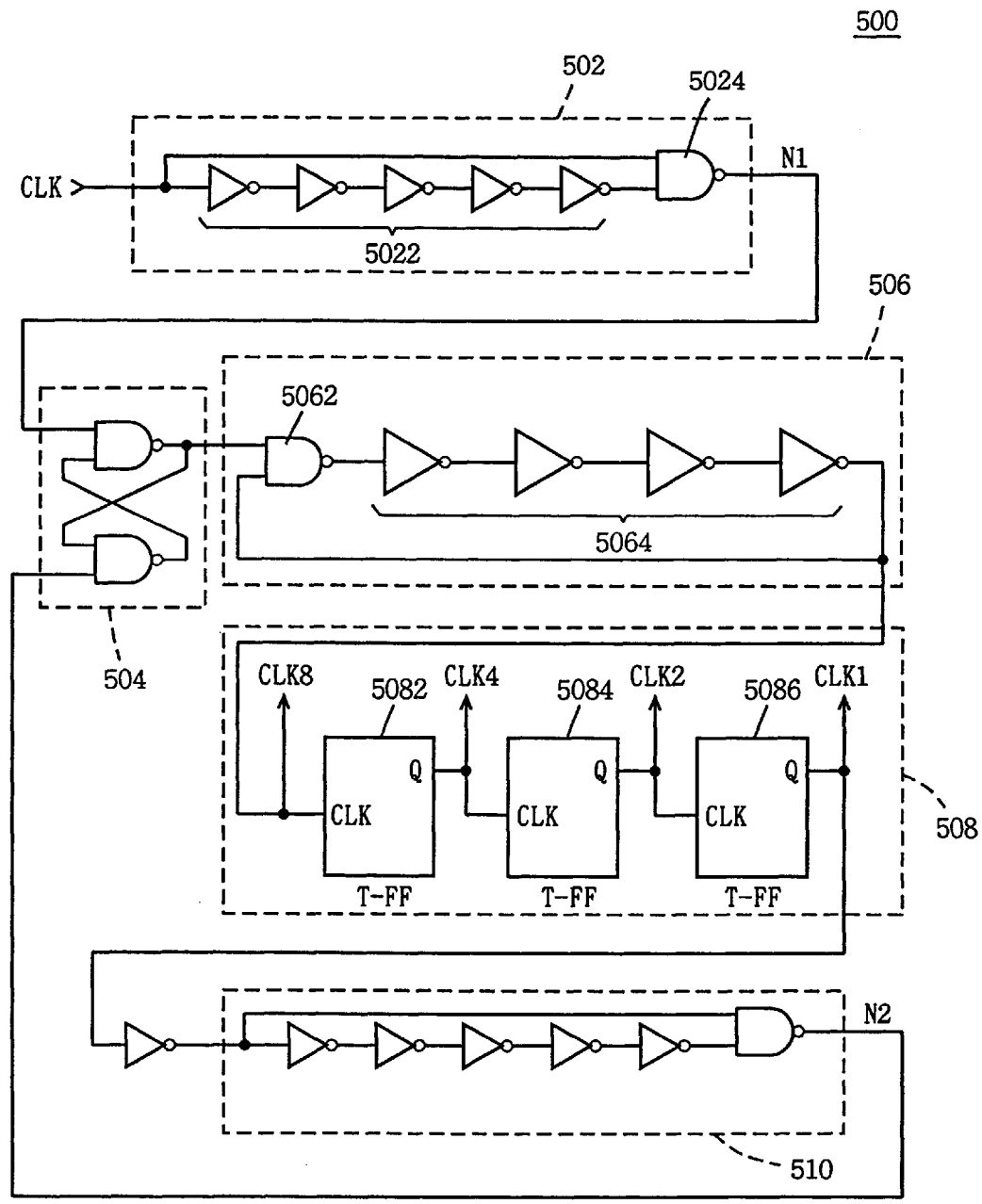
FIG. 17 is a schematic block diagram showing a configuration of an internal clock signal adjustment circuit 500 according to a third embodiment of the present invention.

FIG. 17 is a schematic block diagram showing a configuration of an internal clock signal adjustment circuit 500 according to a third embodiment of the present invention.

For example, the internal clock adjustment circuit can be substituted for internal clock adjustment circuit 200 of SDRAM 1000 according to the first embodiment. Furthermore, the internal clock adjustment circuit can be used as a circuit for generating an internal clock signal for the test mode period for more general synchronous semiconductor integrated circuit devices.

Internal clock adjustment circuit 500 includes: a one-shot generation circuit 502 receiving signal CLK equal in cycle to external clock signal ext.CLK and generating a one-shot pulse signal; an RS flip-flop circuit 504 set depending on an output from one-shot generation circuit 502; an oscillation circuit 506 starting an oscillation operation in response to activation of an output from RS flip-flop circuit 504; a counter circuit 508 counting a clock signal output from oscillation circuit 506; and a one-shot generation circuit 510 receiving a count output from counter circuit 508 and generating a one-shot pulse signal when a predetermined number of count operations are completed; wherein the output level of RS flip-flop circuit 504 is reset in response to an output signal from one-shot generation circuit 510.

One-shot generation circuit 502 includes a delay circuit 5022 receiving signal CLK, delaying the received signal for a predetermined time and outputting the delayed signal, and an NAND circuit 5024 receiving an output from delay circuit 5022 and signal CLK.

Clock generation circuit 506 includes an NAND circuit 5062 having one input node receiving the output from RS flip-flop circuit 504, and a delay circuit 5064 receiving an output from NAND circuit 5062, delaying the received output for a predetermined time and outputting the delayed received output. An output from delay circuit 5064 is coupled with the other input node of NAND circuit 5062.

Counter circuit 508 includes T flip-flop circuits 5082, 5084 and 5086 in three stages that are serially connected. Hereinafter, an input signal to counter circuit 508 will be referred to as signal CLK8, an output from T flip-flop circuit 5082 as signal CLK4, an output from T flip-lop circuit 5084 as clock signal CLK2, and an output signal from T flip-flop circuit 5086 as signal CLK1.

One-shot generation circuit 510 is similar in configuration to one-shot generation circuit 502.

Figure 18:
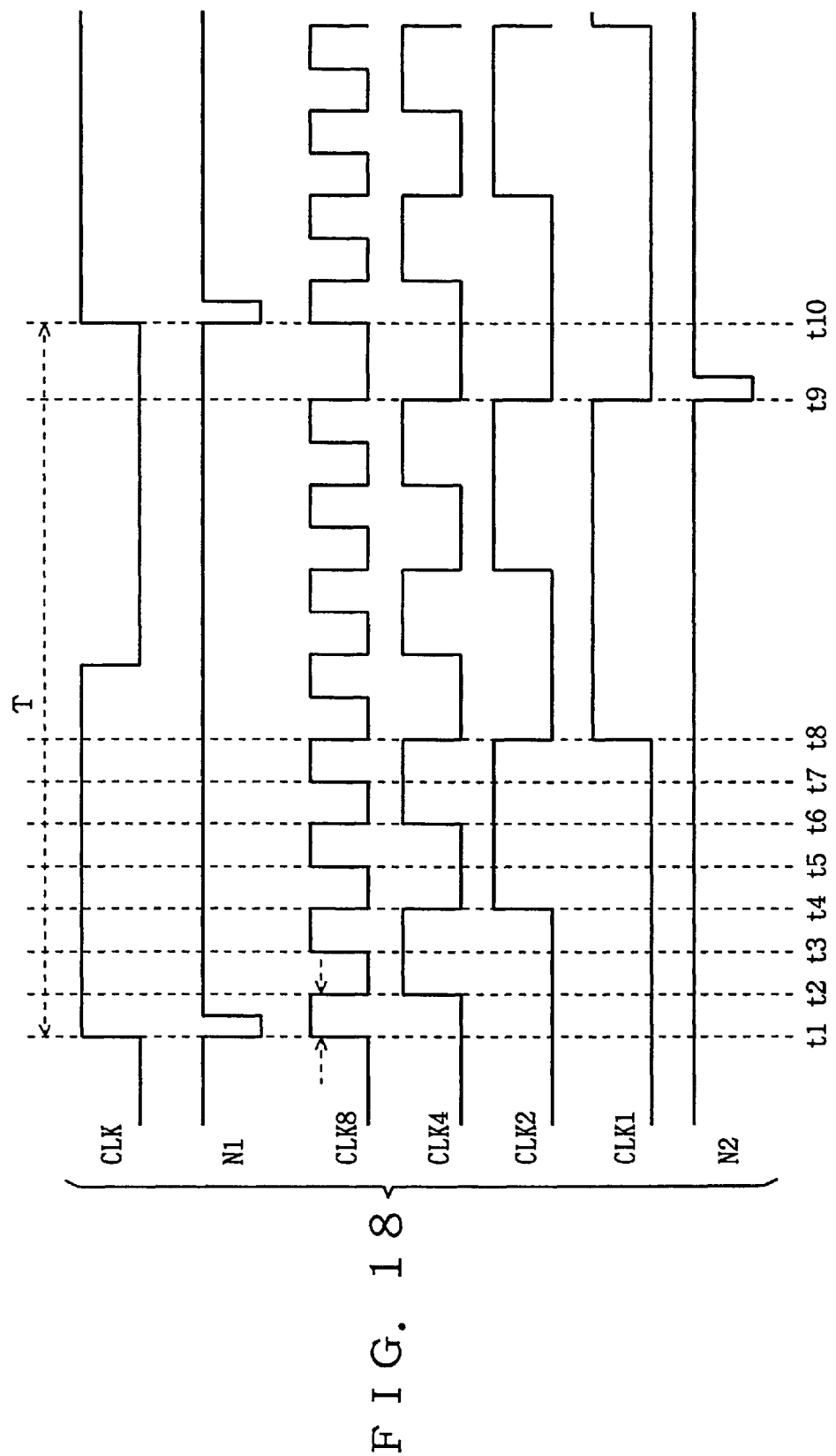
FIG. 18 is timing charts for representing an operation of internal clock signal adjustment circuit 500.

FIG. 18 shows timing charts for representing an operation of internal clock adjustment circuit 500 shown in FIG. 17.

At time t1, one-shot generation circuit 502 responds to activation of clock signal CLK to output a signal N1 of one-shot pulse which attains an active low level for a predetermined period of time.

Responsively the output from RS flip-flop circuit 504 is set and clock generation circuit 506 starts to output the clock signal. At time t2, in response to a transition of signal CLK8 from high level to low level the output from T flip-flop circuit 5082 transitions to an active state. Thereafter, signal CLK4 transitions at the frequency twice that of signal CLK8.

Then, in response to the transition of signal CLK4 from high level to low level at time t4, signal CLK2 as the output signal from T flip-flop circuit 5084 attains an active state.

Thereafter, signal CLK2 transitions at the cycle twice that of signal CLK4, that is, the cycle four times that of signal CLK8.

Then, at time t8, signal CLK1 attains an active state in response to a transition of signal CLK2 from high level to low level.

Thereafter, signal CLK1 transitions at the cycle twice that of signal CLK2, that is, the cycle eight times that of signal CLK8.

At time t9 when signal CLK1 attains a low level after signal CLK8 is activated eight times, one-shot generation circuit 510 responsively outputs a pulse signal having a predetermined period of activation time and the output level of RS flip-flop circuit 504 is reset responsively. At this time point, the oscillation operation of oscillation circuit 506 stops. Then, when signal CLK again attains an active state at time t10, operations similar to those provided during times t1 through t9 are responsively repeated.

Through the operations as described above, internal clock adjustment circuit 500 outputs clock signal CLK8 activated eight times, clock signal CLK4 activated four times and clock signal CLK2 activated twice during one cycle period of clock signal CLK having the same cycle as external clock signal ext.CLK.

By applying any of these clock signals as internal clock signal int.CLK, an internal circuit of a semiconductor integrated circuit device can be operated at a higher frequency than external clock signal ext.CLK in the period of the test mode. Thus rapidly operating semiconductor integrated circuit devices can be tested at lower testing cost.

Fourth Embodiment

Figure 19:
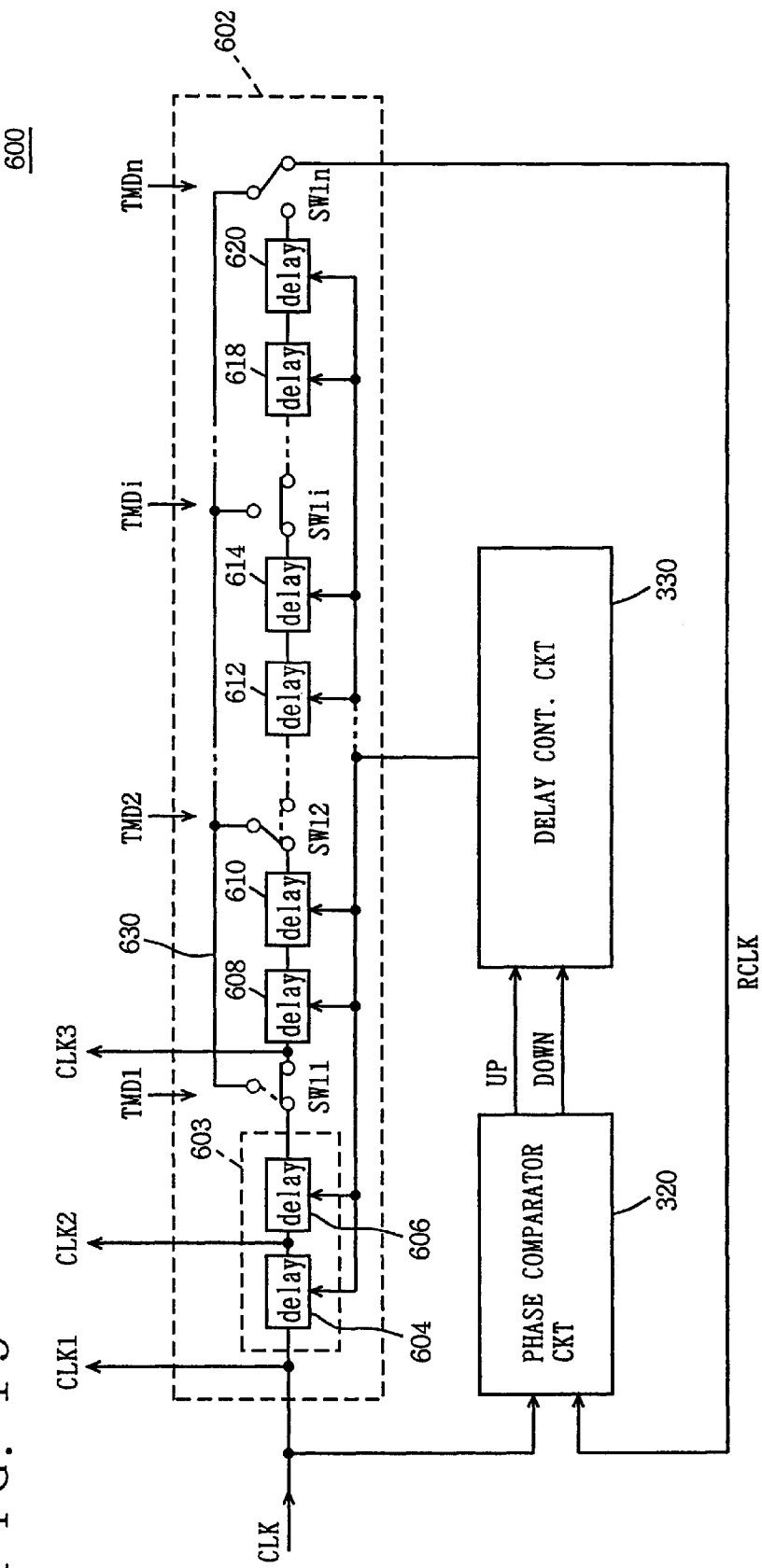
FIG. 19 is a schematic block diagram showing a configuration of a DLL circuit 600 included in an internal clock signal adjustment circuit according to a fourth embodiment of the present invention.
Figure 21:
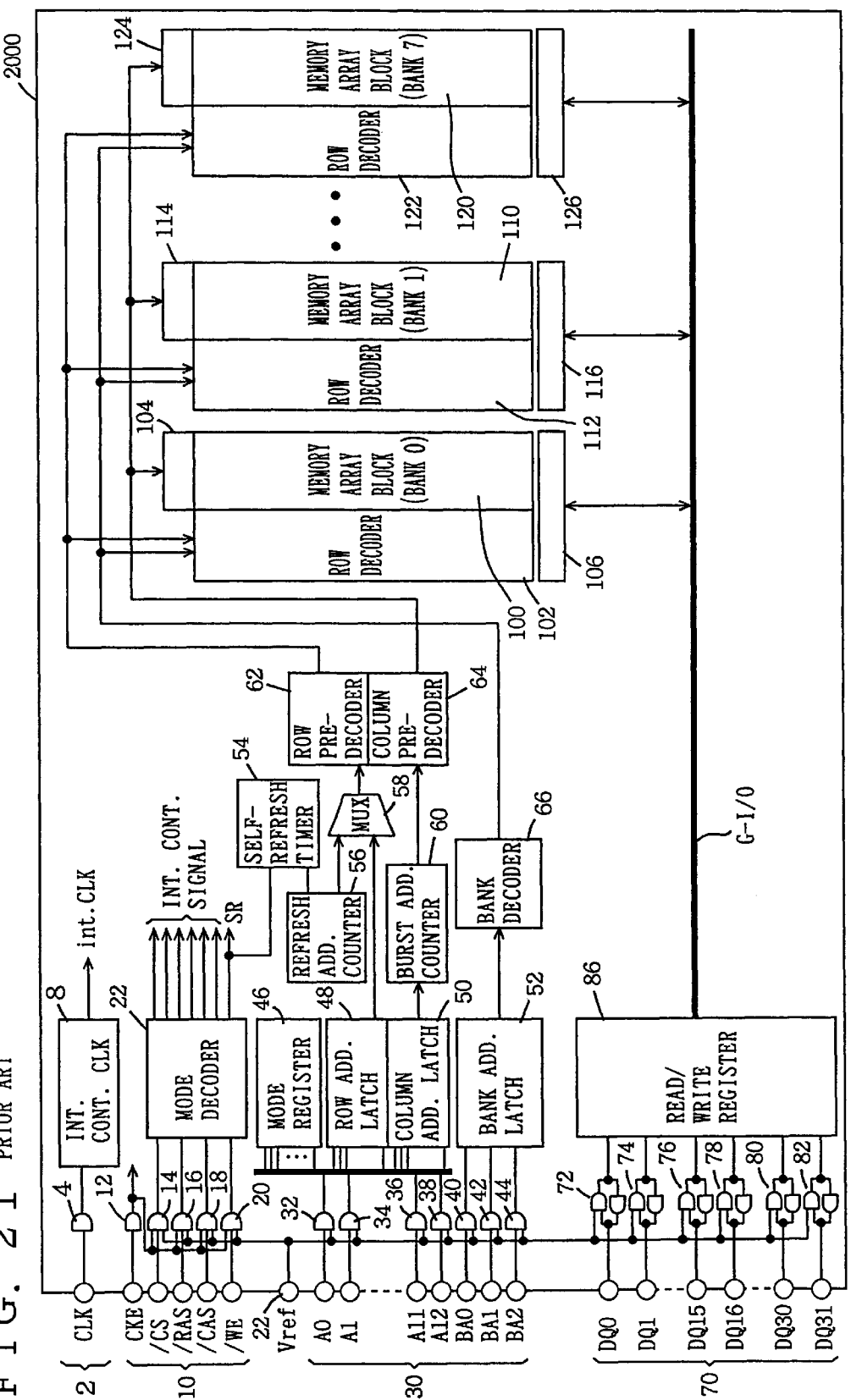
FIG. 21 is a schematic block diagram showing a configuration of a conventional synchronous semiconductor memory device 2000.
Figure 22:
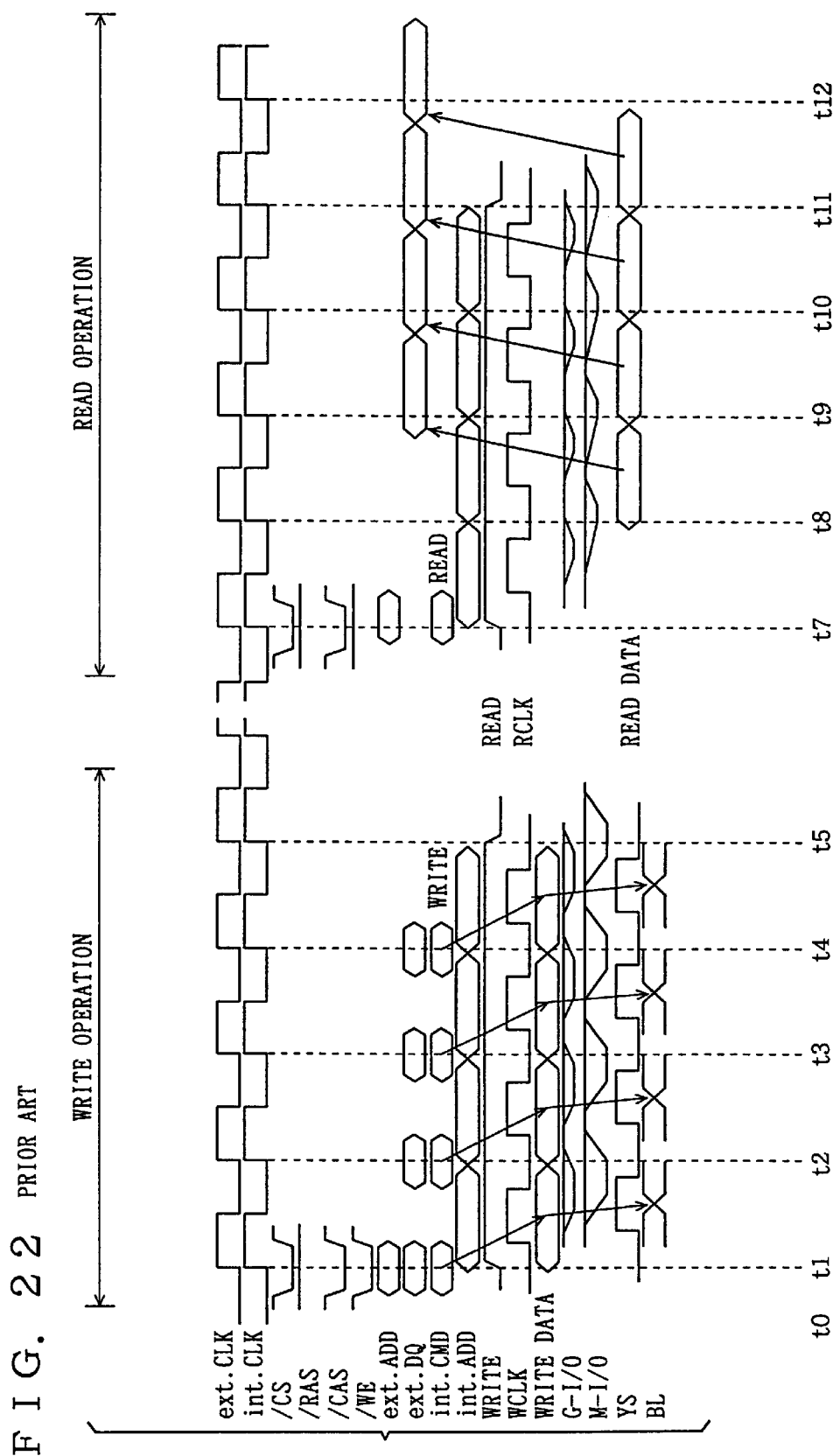
FIG. 22 is timing charts representing an operation of conventional synchronous semiconductor memory device 2000.

FIG. 19 shows a configuration of a DLL circuit 600 included in an internal clock adjustment circuit according to a fourth embodiment of the present invention.

The internal clock adjustment circuit according to the fourth embodiment is different from the internal clock adjustment circuit according to the first embodiment in the configuration of the DLL circuit.

In DLL circuit 600 according to the fourth embodiment, a phase comparator circuit compares the phase of clock signal CLK having the same cycle as external clock signal ext.CLK with a looped signal RCLK and outputs either a signal UP or a signal DOWN depending on whether the phase of signal RCLK is advanced or delays with respect to that of signal CLK. An output from phase comparator circuit 320 is supplied to delay control circuit 300 to simultaneously adjust the delay time of each of delay circuits 604–620 to synchronize the phases of signals CLK and RCLK with each other.

As has been described above, if an external test device is used to test a synchronous semiconductor memory device, generally the operation of the synchronous semiconductor memory device is tested in synchronization with an external clock signal supplied from an external tester. However, if an internal clock signal is adapted to be higher in frequency than the external clock signal from the tester so that a synchronous semiconductor memory device capable of rapid operation can be tested using an inexpensive system, a synchronization operation that is provided with the internal clock adjustment circuit configured as described in the first embodiment results in the disadvantage as described below.

In the normal operation an internal clock signal for the test operation is not generated and variable delay circuit 602 only has delay circuits 604 and 606 connected to the loop of DLL circuit 600.

In other words, in the normal operation the time for which the external clock signal is delayed in the DLL circuit is only required to correspond to approximately one cycle of the external clock signal. Accordingly, if the frequency of an external clock signal is equivalent to the operating frequency of an SDRAM or the like, the external clock signal is only required to be delayed in the DLL circuit by a relatively short period of time.

Since the total amount of delay of delay circuits 604 and 606 corresponds to the amount of delay corresponding to one cycle of external clock signal ext.CLK, the delay time for each delay circuit is set at ½ of the cycle of external clock signal ext.CLK.

Such a delay time for each delay stage is adjusted by signals CP and CN output from delay control circuit 330.

By contrast to such a normal operation, let us assume that while an SDRAM or the like enters the test operation mode with the operating frequency of the SDRAM or the like larger than the frequency of external clock signal CLK from a test device, only delay circuits 604 and 606 are still connected to the loop of DLL circuit 600 to effect a synchronization operation with external clock signal CLK. In this example, the delay time required for the synchronization operation can exceed the range of the delay control data of the DLL circuit and the synchronization between external clock signal CLK and the output signal from the DLL circuit may thus not be achieved.

Furthermore, the test operation mode requires the potential levels of control signals CP and CN to be significantly varied even when the synchronization operation can be effected. In other words, a period of time is required between setting test mode and initiating the test mode operation.

Furthermore, increasing the respective varied widths of signals CP and CN output from delay control circuit 330 requires a complicated configuration of delay control circuit 330.

Accordingly, the DLL circuit of the fourth embodiment provides the operation as described below to overcome the disadvantages described above.

Hereinafter, in order to simplify the description, the frequency of external clock signal CLK in the test operation mode is ½ of that of external clock signal CLK in the normal operation.

More specifically, it is assumed in FIG. 19 that in the normal operation, switch circuit SW11 is set to be connected to an interconnection 630 while switch circuit SW1n (the switch circuit for changing the connection of the output from the last-stage delay circuit 620) is set to connect interconnection 630 and phase comparator circuit 320 together.

Phase comparator circuit 320 compares the phase of the external clock signal CLK that is delayed by delay circuits 604 and 606 with the phase of external clock signal CLK to synchronize the phases of the two signals with each other.

External clock signal CLK supplied from the tester device in the test mode of operation has half the frequency or twice the cycle of external clock signal CLK in the normal mode of operation. In this example, switch circuits SW1, SW12, . . . , SWi, . . . , SW1n in variable delay circuit 302 are controlled by signals TMD1, TMD2, . . . , TMDi, . . . , TMDn from mode register 46 to have their connection changed as described below.

More specifically, switch circuit SW11 is set to connect an output node of delay circuit 606 to an input node of delay circuit 608.

Switch circuit SW12 is set to connect an output of delay circuit 610 to interconnection 630. Switch circuit SW1n is set to connect interconnection 630 to phase comparator circuit 320.

Meanwhile the other switch circuits SW13 to SW1n−1 are each set to provide the connection to an input node of the subsequent delay circuit to decrease the parasitic capacitance of interconnection 630 and reduce any signal delay on interconnection 630.

In other words, phase comparator circuit 320 compares the phase of the external clock signal CLK delayed by delay circuits 604, 606, 608 and 610 with the phase of external clock signal CLK to synchronize the phases of the two signals with each other.

That is, the period of external clock signal CLK in the test mode of operation is doubled as compared with that of external clock signal CLK in the normal mode of operation the totaled amount of delay in variable delay circuit 602 in the test mode of operation is also required to be doubled as compared with that of delay in variable delay circuit 602 in the normal mode of operation. Accordingly, the number of the delay circuits included in the delay loop within variable delay circuit 602 is also doubled.

Since switch circuits SW11–SW1n are controlled as described above, the delay time of each of delay circuits 604–610 in the normal mode of operation may be almost equal to that of each of delay circuits 604–610 in the test mode of operation.

In other words, this means that the values of signals CP and CN output from delay control circuits 330 to control the value of the operating current for each delay circuit described with reference to FIG. 13 may be almost unchanged between the normal mode of operation and the test mode of operation.

That is, if external clock signal CLK has a long cycle in the test mode of operation, such an event can be prevented that the delay time required for the synchronization operation that exceeds the range of the delay control data of the DLL circuit results in external clock signal CLK and the output signal from the DLL circuit failing to synchronize with each other.

Furthermore, in shifting to the test mode of operation the time required to achieve the synchronization operation can be reduced and the configuration of delay control circuit 300 can also be simplified.

Figure 20:
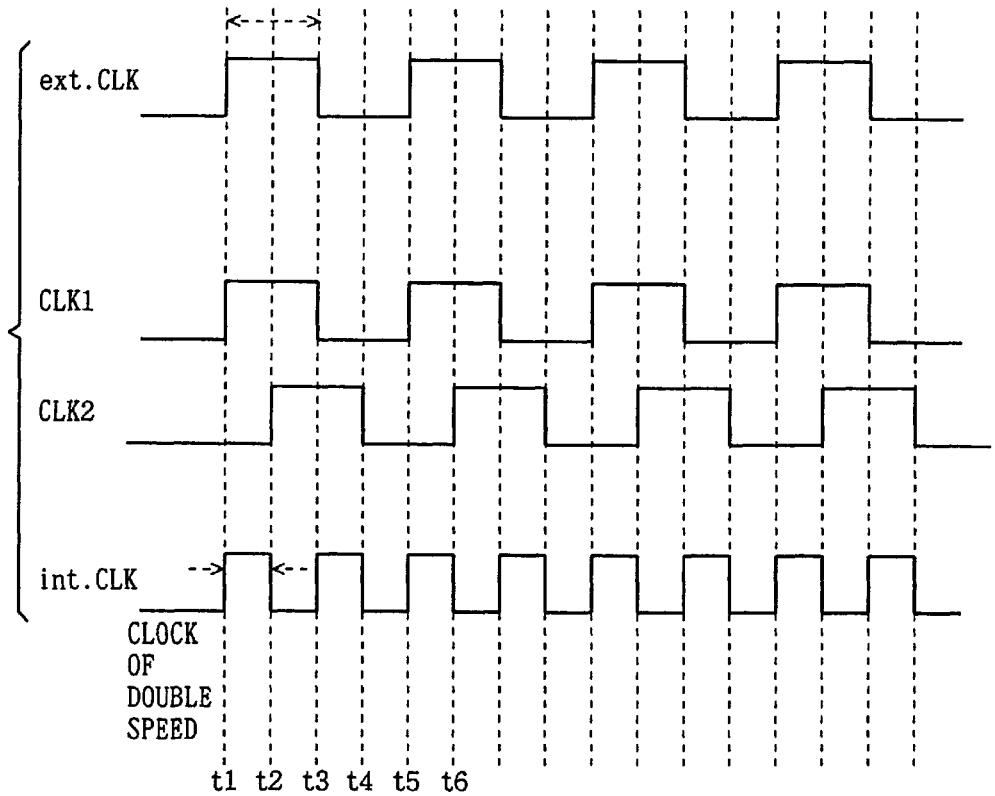
FIG. 20 is timing charts for representing an operation of DLL circuit 600.

FIG. 20 shows timing charts for illustrating an operation for generating an internal clock signal in the test mode of operation that is doubled in frequency as compared with an internal clock signal provided in the normal mode of operation.

It should be noted that the configuration which allows the internal clock signal int.CLK doubled in frequency to be produced from signals CLK1 and CLK2 respectively input to delay circuits 604 and 606 in variable delay circuit 602 of DLL circuit 600 shown in FIG. 19 is similar to the configuration of clock cycle converter circuit 400 provided in the first embodiment and described with reference to FIG. 5.

That is, internal clock signal int.CLK is the exclusive-OR of signal CLK1 synchronized with external clock signal CLK and signal CLK2 delayed with respect to signal CLK1 by one fourth of the cycle of external clock signal CLK.

From times t1 to t2, signal CLK1 is of high level and signal CLK2 is of low level and internal clock signal int.CLK is thus of high level.

From times t2 to t3, signal CLK1 is of high level and signal CLK2 is of high level and internal clock signal int.CLK is thus of low level.

Thereafter, internal clock signal int.CLK similarly transitions at the frequency twice that of external clock signal CLK.

If in the test mode of operation the frequency of internal clock signal int.CLK is higher than that of external clock signal CLK, switch circuits SW11–SW1n are switched in response to test mode signals TMD1, TMD1, . . . , TUDi, . . . , TMDn supplied to the DLL circuit, respectively, to set the number of the delay stages connected in the delay loop to correspond to the ratio between the cycle of the external clock signal CLK and that of internal clock signal int.CLK.

The values of test mode signals TMD1–TMDn vary depending on how mode register 46 is set.

For an increased ratio of the frequency of internal clock signal int.CLK to that of the external clock signal, the FIG. 19 DLL circuit 600 in the test mode of operation has an increased number of the delay circuits included in the delay loop and the control signals are thus not required to be significantly changed in potential level.

As has been described above, this means that the time taken between setting the test mode and starting an operation in the test mode can further be reduced. Furthermore, signals CP and CN output from delay control circuit 330 can also be reduced in the width of variance and the configuration of delay control circuit 330 can also be simplified.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A synchronous semiconductor integrated circuit device operating in response to an external clock signal, receiving a control signal, and transmitting and receiving data to and from an external, comprising:

an internal synchronization signal generation circuit controlled by said control signal to generate an internal clock signal corresponding to said external clock signal in a first mode of operation, and said internal clock signal activated synchronously with activation of said external clock and attaining an active state N times during one cycle of said external clock in a second mode of operation, N representing a natural number and being larger than two;

an internal circuit controlled by said control signal and synchronizing with said internal clock signal to apply a predetermined process to said data; and a data input/output circuit synchronizing with said internal clock signal to output data from said internal circuit.

2. The synchronous semiconductor integrated circuit device according to claim 1, further comprising:

a control signal input circuit synchronizing with said internal clock signal to receive said control signal; and an address signal input circuit synchronizing with said internal clock signal to receive an address signal; wherein said internal circuit includes a memory cell array having a plurality of memory cells arranged in a matrix, a select circuit responsive to said control signal and said address signal to select a corresponding memory cell, and a read/write circuit transmitting and receiving data between said selected memory cell and said data input/output circuit.

3. The synchronous semiconductor integrated circuit device according to claim 2, further comprising a mode holding circuit holding mode-indicating information indicative of which one of said first and second modes of operation is designated in response to said control signal and said address signal, wherein said internal synchronization signal generation circuit responds to said mode-indicating information to set a frequency of an internal clock signal output therefrom.

4. The synchronous semiconductor integrated circuit device according to claim 1, further comprising:

a control signal input circuit synchronizing with said external clock signal to receive said control signal; and an address signal input circuit synchronizing with said external clock signal to receive said address signal from external; wherein said internal circuit includes a memory cell array having a plurality of memory cell arranged in a matrix, a select circuit responsive to said control signal and said address signal to select a corresponding memory cell, and a read/write circuit transmitting and receiving data between said selected memory cell and said data input/output circuit.

5. The synchronous semiconductor integrated circuit device according to claim 4, further comprising a burst counter responding to an externally supplied address signal to produce synchronously with said internal clock signal an internal address by a number of bits corresponding to a predetermined burst length, wherein:

said select circuit responds to said internal address signal to select a corresponding memory cell; and said read/write circuit in said second mode of operation holds data fed upon a specific activation of said external clock signal and supplies said written data to said read/write circuit synchronously with activation of said internal clock signal.

6. The synchronous semiconductor integrated circuit device according to claim 4, further comprising a mode holding circuit holding mode-indicating information indicative of which one of said first and second modes of operation is designated in response to said control signal and said address signal, wherein said internal synchronization signal generation circuit responds to said mode-indicating information to set a frequency of an internal clock signal output therefrom.

7. The synchronous semiconductor integrated circuit device according to claim 1, wherein said internal synchronization signal generation circuit produces in and second mode of operation and internal clock signal synchronizing with said external clock signal and having a frequency N times a frequency of said external clock N representing a natural number and being larger than two, and wherein said internal synchronization signal generation circuit includes a phase locked loop circuit for synchronizing said external clock signal and said internal clock signal with each other.

8. The synchronous semiconductor integrated circuit device according to claim 1, wherein;

said internal synchronization signal generation circuit comprises a synchronization delay clock generation circuit outputting said internal clock signal in said second mode of operation;

said synchronization delay clock circuit includes a variable delay circuit receiving said external clock signal and outputting a signal delayed by a delay time depending on a level of a delay control signal;

said variable delay circuit has a plurality of delay circuits connected in series, each providing a delay time controlled by said delay control signal; and said synchronization delay clock circuit further includes a phase comparator circuit receiving an output from said variable delay circuit and said external clock signal for phase comparison, a delay control circuit outputting said delay control signal having a level for controlling the output from said variable delay circuit and said external clock signal so as to be synchronized with each other, depending on a result from said phase comparison, and a cycle converting circuit producing said internal clock signal based on a result of exclusive OR operations on pairs of signals among a plurality of delay output signals from said plurality of delay circuits and said external clock signal.

9. The synchronous semiconductor integrated circuit device according to claim 8, wherein:

said variable delay circuit includes $2^m$ delay circuits, m representing a natural number; and said cycle converting circuit includes an exclusive-OR gate effecting an exclusive-OR operation on two signals among the plurality of delay output signals from said delay circuits and said external clock signal, one of said two signals being delayed as compared to the other of said two signals by a delay time provided by $2^{m-1}$ said delay circuits.

10. The synchronous semiconductor integrated circuit device according to claim 8, wherein:

said variable delay circuit includes $2^m$ delay circuits, m representing a natural number;

said cycle converter circuit includes first to m-th logical operation circuits;

said fast logical operation circuit has $2^{m-1}$ exclusive-OR gates, each effecting an exclusive-OR operation on two signals among the plurality of delay outputs from said delay circuits and said external clock signal, one of said two signals being delayed as compared to the other of said two signals by a delay time provided by $2^{m-1}$ said delay circuits;

said i-th logical operation circuit has $2^{m-i}$ exclusive-OR gates, each effecting an exclusive-OR operation on two signals among outputs from $2^{m \cdot (i-1)}$ exclusive-OR gates of a (i-1)th logical operation circuit, one of said two signals being delayed as compared to the other of said two signals by a delay time provided by $2^{(m-i)}$ said delay circuits; and said exclusive-OR operation circuit of said m-th logical operation circuit outputs said internal clock signal.

11. The synchronous semiconductor integrated circuit device according to claim 8, wherein said variable delay circuit further includes means receiving said external clock signal for changing a number of said delay circuits included in a path followed to output a signal delayed by a delay time depending on the level of said delay control signal.

12. The synchronous semiconductor integrated circuit device according to claim 1, wherein:

said internal synchronization signal generation circuit comprises a synchronization clock generation circuit outputting said internal clock signal in said second mode of operation;

said synchronization delay clock generation circuit includes a flip-flop circuit set in response to activation of said external clock signal, a clock pulse generation circuit oscillating a clock of a predetermined cycle in response to activation of an output from said flip-flop circuit, and a counter circuit activating an output in response to a predetermined frequency of activation of an output from said clock pulse generation circuit;

said flip-flop circuit is reset in response to the output from said counter circuit; and either one of the output from said clock pulse generation circuit and the output from said counter circuit is output as said internal clock signal.

* * * * *

UNITED STATES PATENT AND TRADEMARK OFFICE
CERTIFICATE OF CORRECTION

PATENT NO. : 6,385,125 B1
DATED : May 7, 2002
INVENTOR(S) : Ooishi et al.

It is certified that error appears in the above-identified patent and that said Letters Patent is hereby corrected as shown below:

<u>Column 18, line 61, through Columns 19-22,</u>
The claims should read:

1. A synchronous semiconductor integrated circuit device operating in response to an external clock signal, receiving an external control signal, and transmitting and receiving external data, comprising:
an internal clock adjustment circuit including first and second clock transmission paths selectively receiving an external clock signal to output an internal clock signal, said first clock transmission path transmitting the external clock signal as the internal clock signal in a first mode of operation, said second clock transmission path including an internal synchronization signal generation circuit controlled by an internal control signal, and generating the internal clock signal so that the internal clock signal is activated synchronously with activation of the external clock signal and attaining an active state N times during one cycle of the external clock signal in a second mode of operation, N being a natural number larger than two, wherein the internal clock signal and the external clock signal have respective frequencies and a ratio of the frequency of the internal clock signal to the frequency of the external clock signal is different in the first mode and in the second mode, said internal synchronization signal generation circuit including a synchronization delay clock generation circuit generating the internal clock signal based on exclusive OR operations on pairs of signals selected from the external clock signal and a plurality of signals produced by delaying the external clock signal in the second mode;
an internal circuit controlled by the external control signal, synchronizing with the internal clock signal, and applying a process to external data received by said synchronous semiconductor integrated circuit;
a data input/output circuit synchronizing with the internal clock signal and outputting data from said internal circuit;
a control signal input circuit receiving the internal control signal synchronized with the internal clock signal; and
an address signal input circuit receiving an external address signal synchronized with the internal clock signal, wherein said internal circuit includes:
a memory cell array having a plurality of memory cells,
a select circuit responsive to the external control signal and the external address signal to select a corresponding memory cell, and
a read/write circuit transmitting and receiving data between a memory cell selected by said select circuit and said data input/output circuit.

2. The synchronous semiconductor integrated circuit device according to claim 1, further comprising a mode holding circuit holding mode-indicating information indicative of which one of the first and second modes of operation is designated in response to the control signal and the external address signal, wherein said internal synchronization signal generation circuit responds to the mode-indicating information to set a frequency of the internal clock signal.

UNITED STATES PATENT AND TRADEMARK OFFICE
CERTIFICATE OF CORRECTION

PATENT NO. : 6,385,125 B1
DATED : May 7, 2002
INVENTOR(S) : Ooishi et al.

It is certified that error appears in the above-identified patent and that said Letters Patent is hereby corrected as shown below:

3. A semiconductor device comprising:
   an internal clock generator for generating an internal clock signal having a frequency ratio to an external clock signal, in a first mode, higher than the frequency ratio in a second mode, said internal clock generator including first and second transmission paths selectively receiving the external clock signal to output the internal clock signal, said first clock transmission path transmitting the external clock signal as the internal clock signal in the second mode, said second clock transmission path including a synchronization delay clock generation circuit generating the internal clock signal based on exclusive OR operations on pairs of signals selected from the external clock signal and a plurality of signals produced by delaying the external clock signal in the first mode;
   an internal circuit for handling data in accordance with the internal clock signal; and
   a data input circuit for receiving external data in synchronization with the internal clock signal.

4. The semiconductor device according to claim 3, further comprising:
   a control signal input circuit receiving a control signal synchronized with the internal clock signal; and
   an address signal input circuit receiving an address signal synchronized with the internal clock signal, wherein said internal circuit includes a memory cell array having a plurality of memory cells, a select circuit for selecting a memory cell in said memory cell array in response to the control signal and the address signal, and an I/O port circuit for transmitting data from or to the memory cell selected.

5. The semiconductor device according to claim 3, further comprising a mode register for holding information concerning the first mode, wherein said internal clock generator sets a frequency of the internal clock signal in response to the information concerning the first mode.

6. The semiconductor device according to claim 3, further comprising:
   a control signal input circuit for receiving a control signal in synchronization with the external clock signal; and
   an address signal input circuit for receiving an address signal in synchronization with the external clock signal, wherein said internal circuit includes a memory cell array having a plurality of memory cells, a select circuit for selecting a memory cell in said memory cell array in response to the control signal and the address signal, and an I/O port circuit for transmitting data from or to the selected memory cell.

7. The semiconductor memory device according to claim 3, further comprising:
   a control signal input circuit for receiving a control signal in synchronization with the external clock signal; and
   an address signal input circuit for receiving an address signal in synchronization with the external clock signal, wherein said internal circuit includes a memory cell array into which data are written in accordance with the internal clock signal in the first mode.

UNITED STATES PATENT AND TRADEMARK OFFICE
CERTIFICATE OF CORRECTION

PATENT NO. : 6,385,125 B1
DATED : May 7, 2002
INVENTOR(S) : Ooishi et al.

It is certified that error appears in the above-identified patent and that said Letters Patent is hereby corrected as shown below:

8. The semiconductor memory device according to claim 3, wherein said internal clock generator includes:
a variable delay circuit for receiving the external clock signal and outputting a signal delayed by a delay time depending on a level of a delay control signal, said variable delay circuit having a plurality of delay circuits connected in series, each delay circuit providing a delay time controlled by the delay control signal,
a phase comparator receiving an output from said variable delay circuit and the external clock signal for phase comparison,
a delay control circuit for outputting the delay control signal depending on the phase comparison, and
a cycle conversion circuit for producing the internal clock signal based on a result of exclusive OR operations on pairs of signals among a plurality of delay output signals from said plurality of delay circuits and the external clock signal.

9. A semiconductor memory device comprising:
an internal clock generator for generating an internal clock signal having a frequency ratio to an external clock signal, in a first mode, higher than the frequency ratio in a second mode, said internal clock generator including an oscillator, an output of said oscillator being disabled in response to completion of an oscillating operation of said oscillator, a transition edge of the external clock signal triggering the oscillating operation, and the internal clock signal being responsive to the output of said oscillator in the first mode; and
an internal circuit for handling data in accordance with the internal clock signal.

10. The semiconductor memory device according to claim 9, wherein said internal clock generator further includes
a flip-flop circuit set in response to the transition edge of the external clock signal, and
a counter circuit activating an output in response to a number of transitions of the output from said oscillator, said oscillator oscillating in response to activation of an output from said flip-flop circuit, said flip-flop circuit being reset in response to the output from said counter circuit, and one of the outputs from said oscillator and from said counter circuit is output as the internal clock signal.

11. The semiconductor memory device according to claim 9, wherein said internal clock generator further includes a counter for counting cycles of the output from said oscillator and generating an output as the internal clock signal.

UNITED STATES PATENT AND TRADEMARK OFFICE
CERTIFICATE OF CORRECTION

PATENT NO.    : 6,385,125 B1
DATED         : May 7, 2002
INVENTOR(S)   : Ooishi et al.

It is certified that error appears in the above-identified patent and that said Letters Patent is hereby corrected as shown below:

12. A synchronous semiconductor integrated circuit device operating in response to an external clock signal, receiving a control signal, and transmitting and receiving external data, comprising:
an internal synchronization signal generation circuit controlled by a control signal and transmitting an external clock signal as an internal clock signal in a first mode of operation, and generating an internal clock signal activated synchronously with activation of the external clock signal and attaining an active state N times during one cycle of the external clock signal in a second mode of operation, N being a natural number larger than two, wherein the internal clock signal and the external clock signal have respective frequencies and a ratio of the frequency of the internal clock signal to the frequency of the external clock signal is different in the first mode and in the second mode, said internal synchronization signal generation circuit including an oscillator activated synchronously with the external clock signal and starting to oscillate at a frequency higher than the external clock signal wherein said oscillator suspends oscillation after the internal clock signal attains the active state N times and resumes oscillating upon activation of the external clock signal;
an internal circuit controlled by the control signal and synchronizing with the internal clock signal to apply a process to the external data; and
a data input/output circuit synchronizing with the internal clock signal and outputting data from said internal circuit.

13. The synchronous semiconductor integrated circuit device according to claim 12, wherein said internal synchronization signal generation circuit further includes a frequency divider outputting a signal indicating number of active states of the internal clock signal.

14. The synchronous semiconductor integrated circuit device according to claim 13, wherein N equals $2^m$, m being a natural number, and said frequency divider includes m serially connected ½ frequency dividers.

Signed and Sealed this

Eighteenth Day of February, 2003

JAMES E. ROGAN
*Director of the United States Patent and Trademark Office*